United States Patent
Ihara et al.

(10) Patent No.: US 8,716,769 B2
(45) Date of Patent: May 6, 2014

(54) IMAGE SENSORS INCLUDING COLOR ADJUSTMENT PATH

(75) Inventors: Hisanori Ihara, Seongnam-si (KR); Chang-rok Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 13/561,937

(22) Filed: Jul. 30, 2012

(65) Prior Publication Data

US 2013/0175582 A1   Jul. 11, 2013

(30) Foreign Application Priority Data

Jan. 10, 2012   (KR) ........................ 10-2012-0003082

(51) Int. Cl.
   *H01L 31/062*   (2012.01)
(52) U.S. Cl.
   USPC ............ 257/291; 257/292; 257/293; 257/294
(58) Field of Classification Search
   USPC ................................. 257/291, 292, 293, 294
   See application file for complete search history.

(56) References Cited

U.S. PATENT DOCUMENTS

| 7,364,960 B2 | 4/2008 | Lyu |
| 2010/0117126 A1 | 5/2010 | Takahashi |

FOREIGN PATENT DOCUMENTS

| JP | 2010-114322 A | 5/2010 |
| JP | 2010-199157 A | 9/2010 |
| KR | 10-2010-0076254 A | 7/2010 |

*Primary Examiner* — Tan N Tran
(74) *Attorney, Agent, or Firm* — Myers Bigel Sibley & Sajovec, P.A.

(57) ABSTRACT

An image sensor includes a transfer transistor including a vertical gate portion extending in a depth direction of a substrate in an active region of the substrate and photodiode regions located at positions of different depths with respect to a top surface of the substrate in the active region. At least one color adjustment path extends between at least two photodiode regions of the photodiode regions and provides a charge movement path between the at least two photodiode regions.

20 Claims, 17 Drawing Sheets

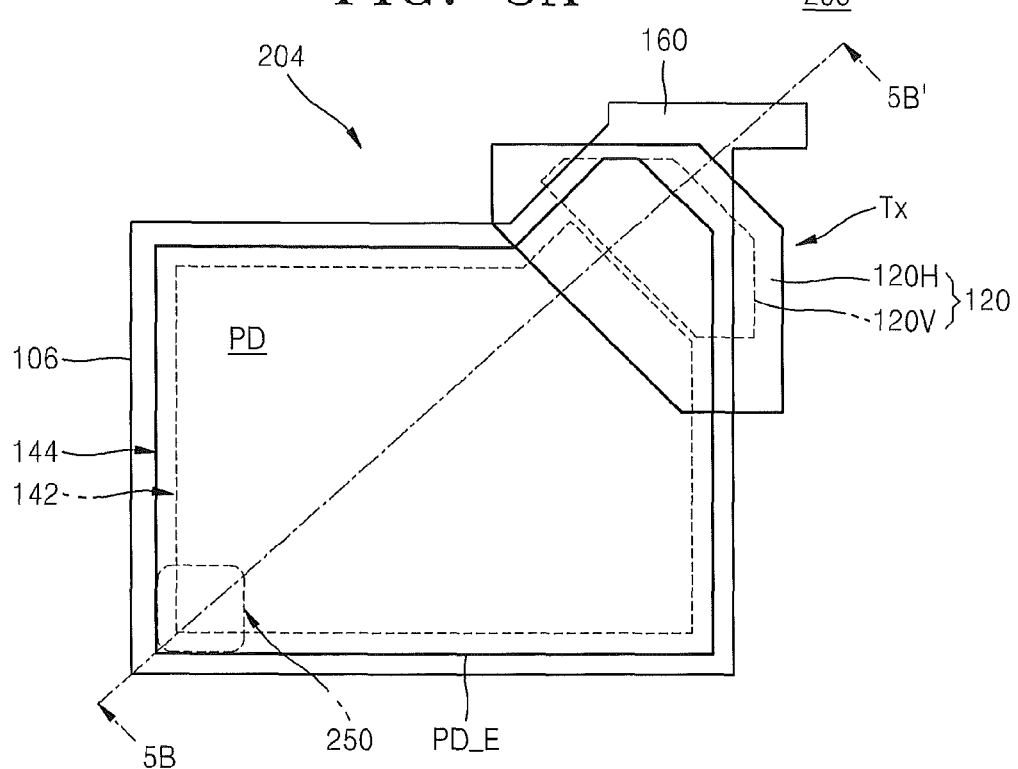
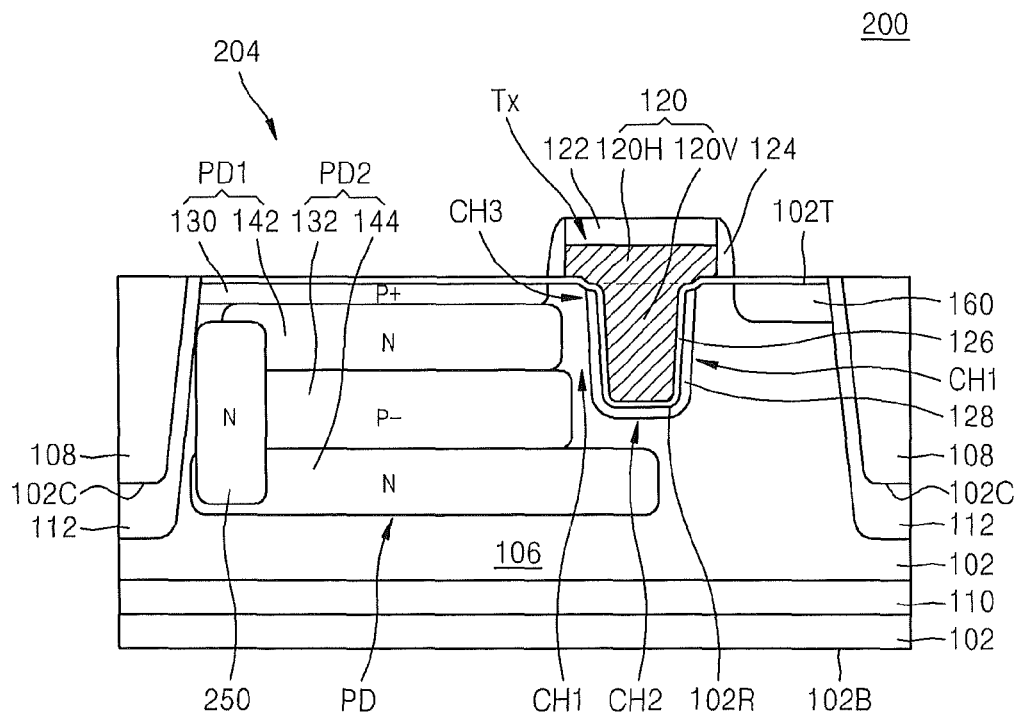

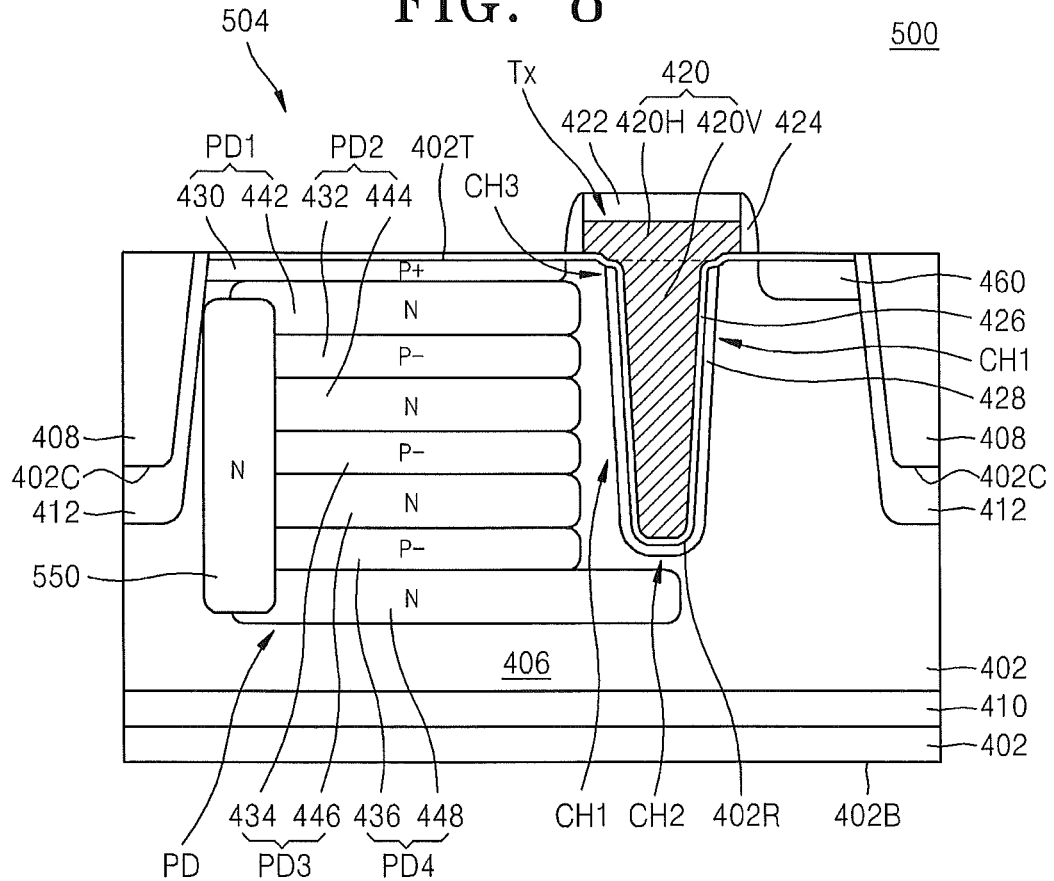

IMAGE SENSORS INCLUDING COLOR ADJUSTMENT PATH

CROSS-REFERENCE TO RELATED APPLICATION

This application claims the benefit of Korean Patent Application No. 10-2012-0003082, filed on Jan. 10, 2012, in the Korean Intellectual Property Office, the disclosure of which is incorporated herein in its entirety by reference.

BACKGROUND

Various embodiments described herein relate to an image sensor that converts an optical image into an electrical signal, and more particularly, to an image sensor including unit pixels, each unit pixel having a plurality of photodiode regions.

Due to an increase of a pixel density of an image sensor, a pixel size may decrease. Unit pixels of the image sensor include photodiodes that are photoelectric conversion devices. A horizontal area of a photodiode may decrease due to high integration of a complementary metal-oxide-semiconductor (CMOS) image sensor, so that a full well capacity (FWC), which is a capacity of the photodiode that receives charges, may also decrease. In the photodiode with decreased FWC, the FWC may vary in each red (R), green (G), and blue (B) color, which may make it difficult to obtain a desired sensitivity and color quality.

SUMMARY

According to various embodiments described herein, there is provided an image sensor including a device isolation region defining an active region in a unit pixel of a substrate; a transfer transistor including a vertical gate portion extending from a top surface of the substrate in a depth direction of the substrate in the active region, and a channel region vertically extending along sidewalls of the vertical gate portion in the active region. A plurality of photodiode regions are located at positions of different depths with respect to the top surface of the substrate in the active region. At least one color adjustment path area is located at a position spaced apart from the channel region. The at least one color adjustment path area extends between at least two photodiode regions of the plurality of photodiode regions, and provides a charge movement path, such as an electron movement path, between the at least two photodiode regions.

According to other embodiments described herein, there is provided an image sensor including a substrate including a top surface, a bottom surface, an active region and a transfer transistor including a vertical gate portion extending from the top surface of the substrate in a depth direction of the substrate in the active region. A plurality of photodiode regions are located at positions of different depths with respect to the top surface of the substrate in the active region. At least one color adjustment path area is located at a position spaced apart from the vertical gate portion in the active region. The at least one, color adjustment path area extends between at least two photodiode regions of the plurality of photodiode regions, and provides a charge movement path, such as an electron movement path, between the at least two photodiode regions. A color filter is provided on the substrate and a micro-lens is provided on the color filter.

The image sensor may include a backside illumination type image sensor.

According to various other embodiments described herein, an image sensor comprises a semiconductor substrate including a face, and a plurality of semiconductor photodiodes in the semiconductor substrate, at different depths from the face, and being configured to absorb light of different colors. A semiconductor color adjustment path in the semiconductor substrate extends between at least two of the semiconductor photodiodes that are different depths from the face. The semiconductor color adjustment path may extend between the at least two of the semiconductor photodiodes at central portions thereof, so as to be surrounded by the at least two of the semiconductor photodiodes, and/or at peripheral portions thereof, so as to be only partially surrounded by at least two of the semiconductor photodiodes. The image sensor may also include a transfer transistor that extends into the semiconductor substrate from the face, wherein the semiconductor color adjustment path extends between the at least two of the semiconductor photodiodes at peripheral portions thereof that are furthest away from the transfer transistor. Moreover, a respective semiconductor photodiode may include regions of first and second different conductivity types that define a semiconductor junction therebetween that extends generally parallel to the face, and the semiconductor color adjustment path may comprise a pillar of the first conductivity type that extends into the regions of first conductivity type of the semiconductor photodiodes.

BRIEF DESCRIPTION OF THE DRAWINGS

Example embodiments of the inventive concepts will be more clearly understood from the following detailed description taken in conjunction with the accompanying drawings in which:

FIG. 5A is a layout of a unit pixel of an image sensor according to another embodiment of the inventive concepts;

FIG. 5B is a cross-sectional view of the unit pixel of FIG. 5A, taken along a line 5B-5B';

FIG. 8 is a cross-sectional view of a unit pixel of an image sensor according to another embodiment of the inventive concepts;

DETAILED DESCRIPTION OF THE EMBODIMENTS

Figure 1:
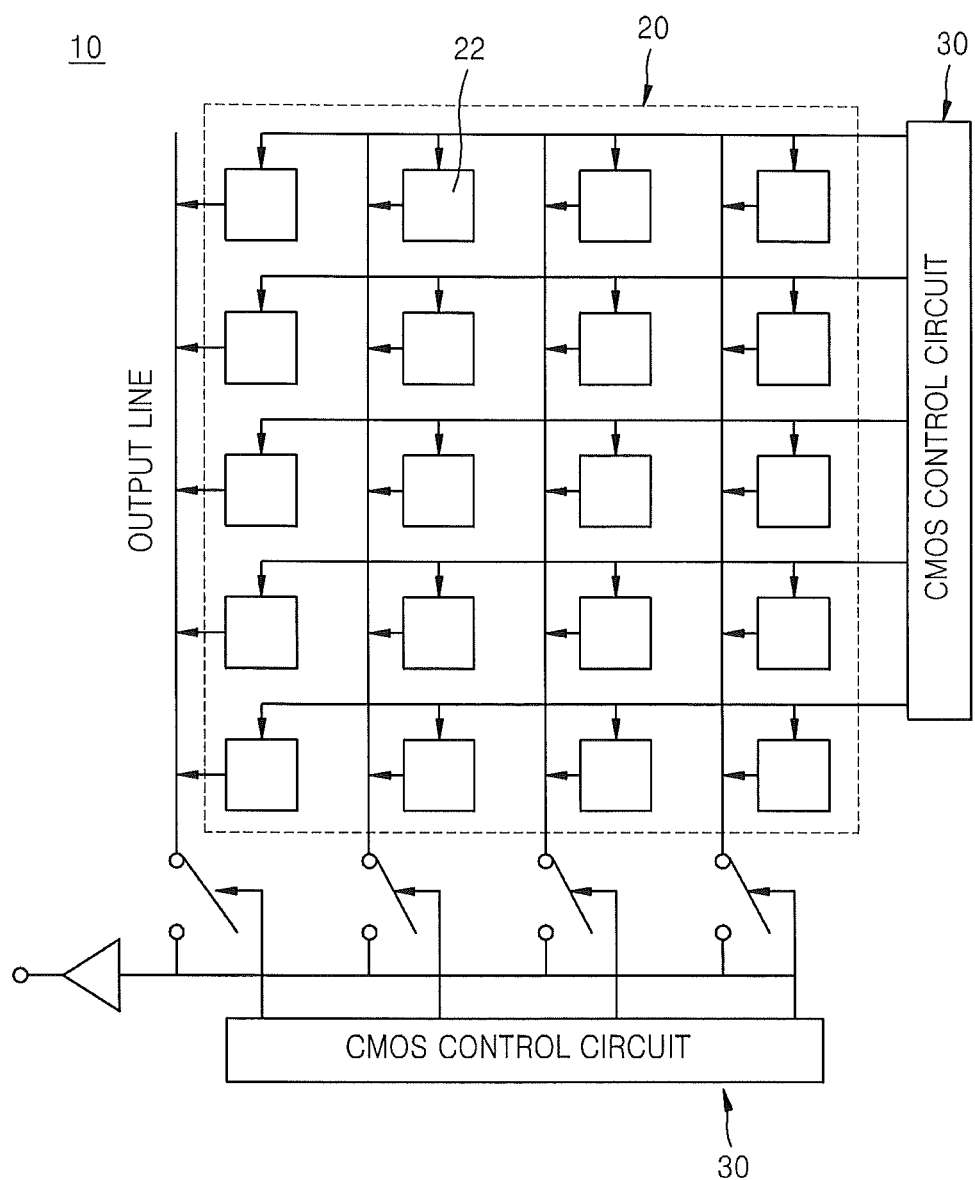
FIG. 1 is a diagram illustrating a configuration of an image sensor according to an embodiment of the inventive concepts.

The attached drawings for illustrating example embodiments of the inventive concepts are referred to in order to gain a sufficient understanding of the inventive concepts, the merits thereof, and the objectives accomplished by the implementation of the inventive concepts.

Hereinafter, the inventive concepts will be described in detail by explaining exemplary embodiments of the inventive concept with reference to the attached drawings. Like reference numerals in the drawings denote like elements, and thus, repeated descriptions thereof are omitted.

The inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Spatially relative terms, such as "beneath," "below," "bottom," "above," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

Also, it should also be noted that in some alternative implementations, the steps of all methods described herein may occur out of the order. For example, two steps illustrated in succession may in fact be executed substantially concurrently or the two steps may sometimes be executed in the reverse order.

With respect to the drawings, shapes in the drawings may be revised according to a manufacturing technology and/or a tolerance. Therefore, the attached drawings for illustrating exemplary embodiments of the inventive concepts are referred to in order to gain a sufficient understanding of the inventive concept, the merits thereof, and the objectives accomplished by the implementation of the inventive concepts.

Expressions such as "at least one of," when preceding a list of elements, modify the entire list of elements and do not modify the individual elements of the list. Moreover, as used herein, the term "and/or" includes any and all combinations of one or more of the associated listed elements and may be abbreviated herein as "/".

FIG. 1 is a diagram illustrating a configuration of an image sensor 10 according to an embodiment of the inventive concepts. FIG. 1 illustrates a configuration of a complementary metal-oxide-semiconductor (CMOS) image sensor (hereinafter, referred to as 'CIS').

Referring to FIG. 1, the image sensor 10 includes a pixel array region 20 and CMOS control circuits 30 that are in/on a circuit substrate. The pixel array region 20 includes a plurality of unit pixels 22 that are arrayed in a matrix. The CMOS control circuit 30 disposed around the pixel array region 20 has a plurality of CMOS transistors (not shown), provides a constant signal to the unit pixels 22 of the pixel array region 20, or controls an output signal.

A structure of the unit pixel 22 varies according to elements that form the unit pixel 22. In other embodiments, the unit pixel 22 may have a structure including 1 through 5 transistors.

Figure 2:
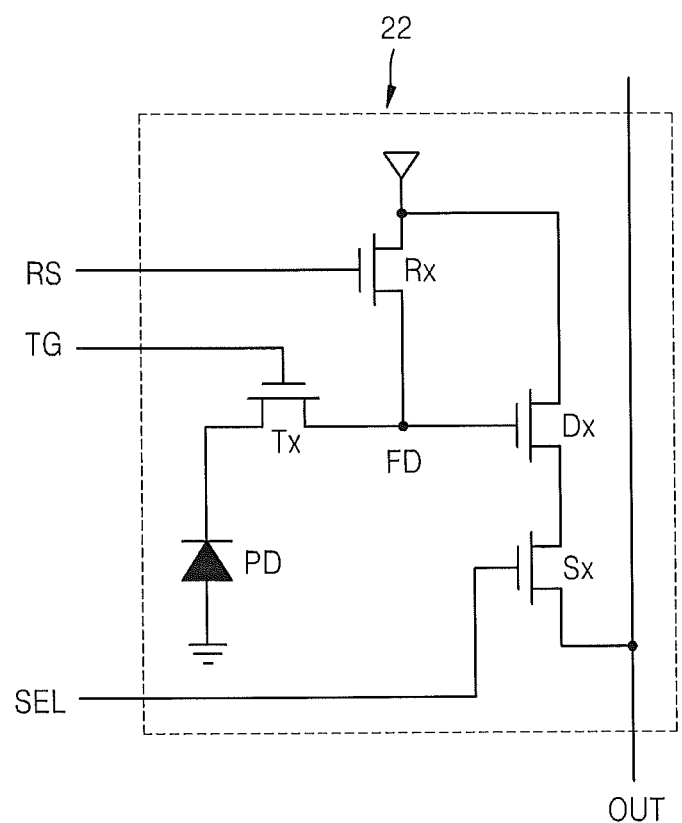
FIG. 2 is an equivalent circuit diagram of a unit pixel of the image sensor of FIG. 1.

FIG. 2 is an equivalent circuit diagram of the unit pixel 22.

Referring to FIG. 2, the unit pixel 22 includes a photodiode PD that receives light, generates photocharges due to photoelectric conversion, and accumulates the charges; a transfer transistor Tx that transfers the charges generated by the photodiode PD to a floating diffusion region FD; a reset transistor Rx that regularly resets the charges stored in the floating diffusion region FD; a drive transistor Dx that functions as a source follower buffer amplifier and buffers a signal in response to the charges stored in the floating diffusion region FD; and a select transistor Sx that performs switching and addressing so as to select the unit pixel 22. In FIG. 2, "RS" indicates a signal applied to a gate of the reset transistor Rx, "TG" is a signal applied to a gate of the transfer transistor Tx, and "SEL" indicates a signal applied to a gate of the select transistor Sx.

FIG. 2 illustrates circuit configuration of a unit pixel comprising one photodiode PD and four MOS transistors, namely, the transfer transistor Tx, the reset transistor Rx, the drive transistor Dx, and the select transistor Sx. However, one or more embodiments of the inventive concepts are not limited thereto.

Figure 3A:
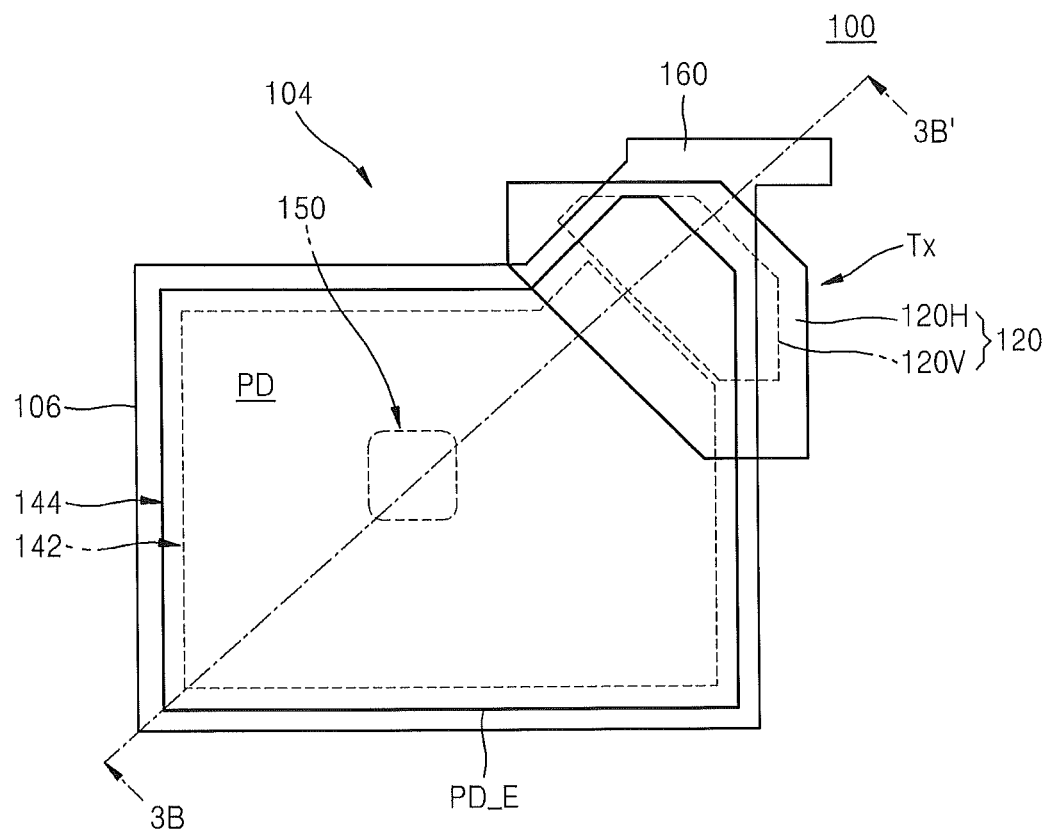
FIG. 3A illustrates a layout of a unit pixel of the image sensor of FIG. 1.
Figure 3B:
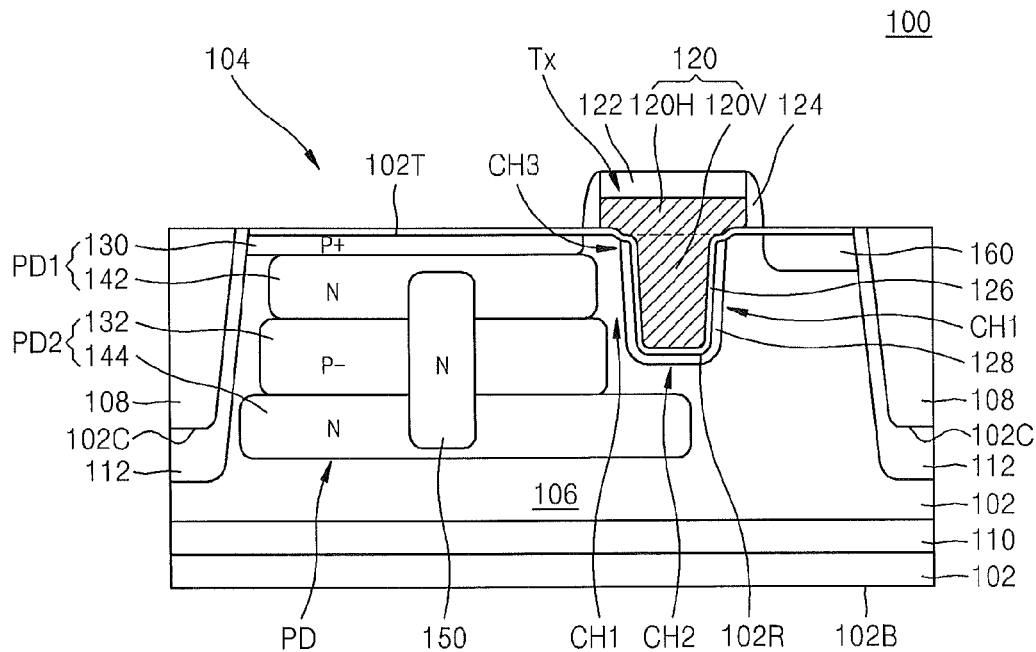
FIG. 3B is a cross-sectional view of the unit pixel of FIG. 3A, taken along a line 3B-3B.

FIGS. 3A and 3B are diagrams of an image sensor 100 according to another embodiment of the inventive concepts. In more detail, FIG. 3A illustrates a layout of a unit pixel 104 of the image sensor 100, and FIG. 3B is a cross-sectional view of the unit pixel 104 of FIG. 3A, taken along a line 3B-3B'. In FIGS. 3A and 3B, like or similar members as those of FIGS. 1 and 2 have like reference numerals, and thus, repeated descriptions thereof are omitted.

Referring to FIGS. 3A and 3B, in the unit pixel 104, a device isolation region 108 defines an active region 106 in a substrate 102. The device isolation region 108 is located in a trench 102C in the substrate 102.

In other embodiments, the substrate 102 is a P-type semiconductor substrate. For example, the substrate 102 may comprise a P-type silicon substrate. A deep well 110 is provided in the substrate 102. In other embodiments, the deep well 110 is a P-type well. A doping density in the deep well 110 is higher than a doping density in the substrate 102.

The unit pixel 104 may be separated from another unit pixel 104 by the device isolation region 108 in the substrate 102. The device isolation region 108 comprises an insulating material. An impurity region 112 that surrounds a sidewall and a bottom surface of the device isolation region 108 is located above the substrate 102. In other embodiments, the impurity region 112 is a P-type well. A doping density in the impurity region 112 is higher than a doping density in the substrate 102. The impurity region 112 may reduce or prevent cross-talk.

In the active region 106, a recess region 102R is provided in the substrate 102. Also, a transfer transistor Tx is provided around the recess region 102R. A gate electrode 120 of the transfer transistor Tx includes a vertical gate portion 120V that extends from a top surface 102T of the substrate 102 along a depth direction of the substrate 102, and a horizontal gate portion 120H that extends from a top portion of the vertical gate portion 120V along the top surface 102T of the substrate 102. The vertical gate portion 120V is provided in the recess region 102R. A top surface of the horizontal gate portion 120H is covered with an insulating capping layer 122, and sidewalls of the horizontal gate portion 120H are covered with insulating spacers 124.

A gate insulating layer 126 is provided between the gate electrode 120 and the substrate 102. A channel impurity region 128 is provided around the recess region 102R of the substrate 102. The channel impurity region 128 is located to surround the vertical gate portion 120V with the gate insulating layer 126 interposed therebetween. In other embodiments, a threshold voltage of the transfer transistor Tx is adjusted due to the channel impurity region 128. In other embodiments, the channel impurity region 128 is provided as a P-type impurity region having a higher doping density than that of the substrate 102.

The transfer transistor Tx includes a first channel region CH1 that vertically extends along sidewalls of the vertical gate portion 120V in the active region 106, a second channel region CH2 that is around a bottom surface of the vertical gate portion 120V, and a third channel region CH3 that is around a bottom surface of the horizontal gate portion 120H.

lathe active region 106, a hole accumulation device (HAD) region 130 is provided at one side of the transfer transistor Tx and has a predetermined thickness from the top surface 102T of the substrate 102 along the depth direction of the substrate 102. The HAD region 130 may comprise a p+ type semiconductor region.

A photodiode PD may be provided in the active region 106. The photodiode PD includes a first photodiode region PD1 and a second photodiode region PD2 that are respectively provided at positions of different depths with respect to the top surface 102T of the substrate 102. Thus, a respective semiconductor photodiode PD1, PD2 includes regions of first and second different conductivity types that define a semiconductor junction (i.e., a P-N junction) therebetween that extends generally parallel to the top face 102T. The first photodiode region PD1 and the second photodiode region PD2 vertically overlap with each other.

The substrate 102 has different light-absorption characteristics according to its depth direction. Thus, in order to accumulate charges such as electrons by photoelectrically converting light that is incident from an external source at various wavelengths, the first photodiode region PD1 and the second photodiode region PD2 above the substrate 102 may have different depths according to lengths of the wavelengths of the incident light.

FIG. 3B illustrates an example in which the photodiode PD consists of two photodiode regions, i.e., the first photodiode region PD1 and the second photodiode region PD2. However, one or more embodiments of the inventive concepts are not limited thereto and thus at least three photodiode regions that vertically overlap with each other may provide the photodiode PD.

The photodiode PD includes a first semiconductor region 132 having a first conductivity type, and a plurality of second semiconductor regions 142 and 144 that have a second conductivity type different from the first conductivity type and that are separated from each other with the first semiconductor region 132 interposed therebetween. The first semiconductor region 132 comprises a P-type impurity region, and the second semiconductor regions 142 and 144 comprise an N-type impurity region. The first photodiode region PD1 includes a junction of the second semiconductor region 142 and the HAD region 130. The second photodiode region PD2 includes a junction of the second semiconductor region 144 and the first semiconductor region 132.

The image sensor 100 includes a color adjustment path area 150. The color adjustment path area 150 provides a charge movement path, such as an electron movement path, between the first photodiode region PD1 and the second photodiode region PD2. The color adjustment path area 150 is embodied as a semiconductor area having the same conductivity type as the second semiconductor regions 142 and 144.

The color adjustment path area 150 is located at a position distant from surfaces of the substrate 102, e.g., surfaces of the substrate 102 in the recess region 102R and surfaces of the substrate 102 in the trench 102C. A defect may exist on the surfaces of the substrate 102 in the recess region 102R and the trench 102C due to a damage of the substrate 102, wherein the surfaces are exposed to an etch environment. If a defect exists in the color adjustment path area 150, an error may occur in a charge transfer or a dark current may be generated, and thus, the color adjustment path area 150 is formed in a position distant from the surfaces of the substrate 102 in the recess region 102R and the trench 102C.

The color adjustment path area 150 is separated from the transfer transistor Tx with a portion of the photodiode PD interposed therebetween. The color adjustment path area 150 is located at a position distant from the first through third channel regions CH1, CH2, and CH3 of the transfer transistor Tx, while the color adjustment path area 150 extends between the first photodiode region PD1 and the second photodiode region PD2. Also, the color adjustment path area 150 is located at a position distant from the device isolation region 108 and the impurity region 112 that surrounds the device isolation region 108.

The color adjustment path area 150 is located in the substrate 102 at a position that does not vertically overlap with the horizontal gate portion 120H of the gate electrode 120, but is not limited thereto. In other embodiments, the horizontal gate portion 120H of the gate electrode 120, which is above the top surface 102T of the substrate 102, may further extend toward a position of the photodiode PD. Also, at least a portion of the color adjustment path area 150 may vertically overlap with the horizontal gate portion 120H of the gate electrode 120.

The color adjustment path area 150 is located at a position spaced apart from a vertical-direction edge PD_E (refer to FIG. 3A) of the photodiode PD toward an inner direction of the photodiode PD. Thus, sidewalls of the color adjustment path area 150 are surrounded by the photodiode PD.

In some embodiments, the color adjustment path area 150 has a pillar shape that extends from the second semiconductor region 142, which is relatively close to the top surface 102T of the substrate 102, to the second semiconductor region 144, which is relatively close to the bottom surface 102B of the substrate 102, while penetrating through the first semiconductor region 132.

In some embodiments, the color adjustment path area 150 completely penetrates through the first semiconductor region 132 in a vertical direction and partially penetrates into the second semiconductor regions 142 and 144 in the vertical direction. In other embodiments, the color adjustment path area 150 may completely penetrate through the first semiconductor region 132, and the second semiconductor regions 142 and 144.

The color adjustment path area 150 extends from a position, which partially and horizontally overlaps with the vertical gate portion 120V, in a parallel direction to a vertical direction with respect to the vertical gate portion 120V. The color adjustment path area 150 has an approximately straight pillar shape but a shape of the color adjustment path area 150 is not limited thereto. In other embodiments, the color adjustment path area 150 may have a shape different from a straight pillar shape.

When signal charges are accumulated in the photodiode PD, the color adjustment path area 150 is used as a charge movement path, such as an electron movement path, by which a charge amount that exceeds a full well capacity (FWC) of one of the first photodiode region PD1 and the second photodiode region PD2 flows to the other one of the first photodiode region PD1 and the second photodiode region PD2. Thus, electrons of light having different wavelengths may be accumulated in the photodiode PD having an increased FWC due to the color adjustment path area 150, without the need for a spatial limitation of the first photodiode region PD1 and the second photodiode region PD2. By using the color adjustment path area 150, without the need for the spatial limitation of the first photodiode region PD1 and the second photodiode region PD2, an FWC for each of the electrons obtained from light having different wavelengths corresponding to different colors may be variably adjusted in various operation environments of the image sensor 100.

In the active region 106, a floating diffusion region 160 having a predetermined thickness extending from the top surface 102T of the substrate 102 in a depth direction of the substrate 102 is located on a side of the transfer transistor Tx, which is opposite to the side where the photodiode PD is located.

Light that is incident to the photodiode PD on the top surface 102T or the bottom surface 102B of the substrate 102 is photoelectrically converted in the first photodiode region PD1 and the second photodiode region PD2, so that signal charges are generated. The generated signal charges are accumulated in the second semiconductor region 142 forming the first photodiode region PD1 or in the second semiconductor region 144 forming the second photodiode region PD2. When a FWC of one of the second semiconductor regions 142 and 144 is exceeded, charges that exceed the FWC may flow to the other one of the second semiconductor regions 142 and 144 via the color adjustment path area 150.

According to a voltage that is applied to the gate electrode 120 of the transfer transistor Tx, a potential of the first through third channel regions CH1, CH2, and CH3 of the transfer transistor Tx may be changed. When a predetermined voltage is applied to the gate electrode 120 of the transfer transistor Tx after signal charges are accumulated in the second semiconductor regions 142 and 144, signal charges in the second semiconductor regions 142 and 144 and the color adjustment path area 150 may be transmitted to the floating diffusion region 160 via the first through third channel regions CH1, CH2, and CH3.

The image sensor 100 includes the first photodiode region PD1 and the second photodiode region PD2 that vertically overlap with each other along the depth direction of the substrate 102, and the color adjustment path area 150 that provides an electron movement path between the first photodiode region PD1 and the second photodiode region PD2, so that the image sensor 100 may increase an FWC in the first photodiode region PD1 and the second photodiode region PD2. Thus, although a size of a unit pixel of the image sensor 100 becomes minute, an FWC in the photodiode PD may be increased and excellent sensitivity and color quality may be achieved.

Figure 3C:
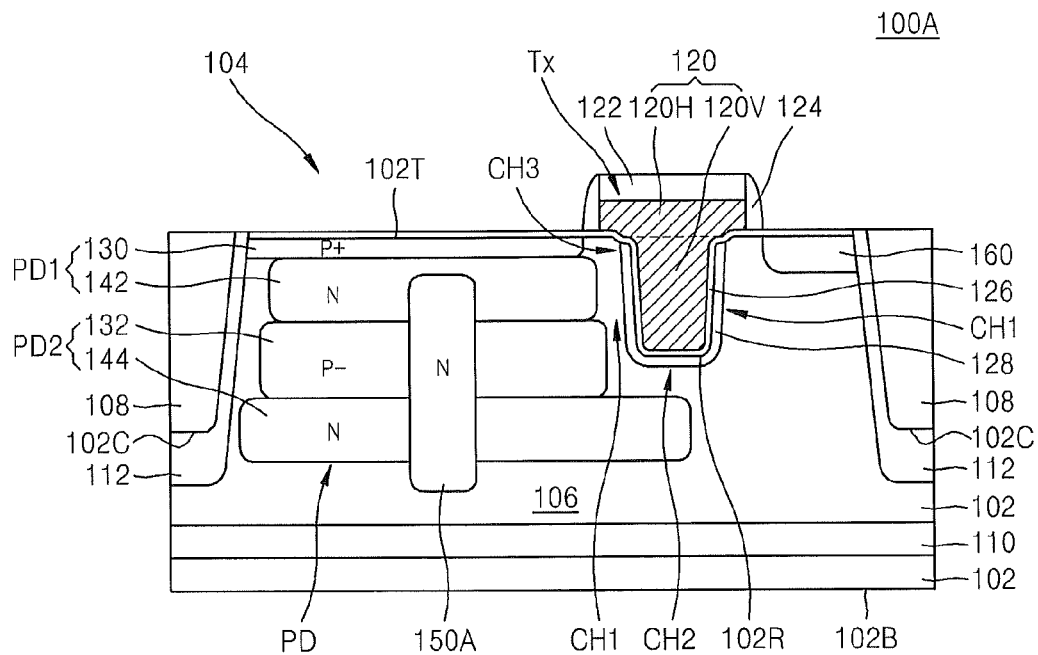
FIG. 3C is a cross-sectional view of an image sensor that is a modification of the image sensor of FIG. 3B, according to another embodiment of the inventive concepts.

FIG. 3C is a cross-sectional view of an image sensor 100A that is a modification of the image sensor 100 of FIG. 3B, according to another embodiment of the inventive concepts. In FIG. 3C, like members as those of FIG. 3B have like reference numerals, and thus, repeated descriptions thereof are omitted here.

Referring to FIG. 3C, the image sensor 100A includes a color adjustment path area 150A. A detailed structure of the color adjustment path area 150A is the same as a structure of the color adjustment path area 150 described with reference to FIG. 3B. However, in FIG. 3C the color adjustment path area 150A completely penetrates through the second semiconductor region 144 in a vertical direction. In other embodiments, the color adjustment path area 150A may be formed to completely penetrate through the second semiconductor region 142.

FIGS. 4A through 4I are cross-sectional views that are sequential processes of a method of manufacturing the image sensor 100, according to an embodiment of the inventive concepts. In FIGS. 4A through 4I, like or similar members as those of FIGS. 1, 2, 3A, and 3B have like reference numerals, and thus, repeated descriptions thereof are omitted.

Figure 4A:
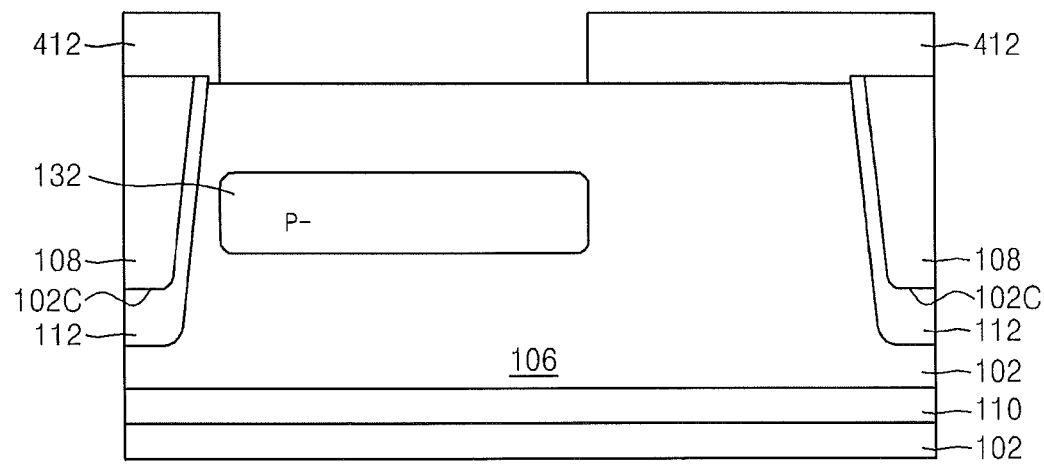
FIGS. 4A through 4I are cross-sectional views that are sequential processes of a method of manufacturing the image sensor, according to an embodiment of the inventive concepts.

Referring to FIG. 4A, a P-type substrate 102 is arranged. A P+ type deep well 110 is formed in the substrate 102. After a trench 102C is formed in the substrate 102, impurity ions are injected to the substrate 102 via an inner wall of the trench 102C, so that a P+ type impurity region 112 is formed around the trench 102C. Afterward, a device isolation region 108 is formed in the trench 102C, thereby defining an active region 106 in the substrate 102.

A first mask 412 is formed above the substrate 102. In one or more embodiments, the first mask 412 is formed of a photoresist layer. Afterward, impurity ions are injected to the active region 106 of the substrate 102 by using the first mask 412 as an ion injection mask, so that a P-type first semiconductor region 132 is formed.

Figure 4B:
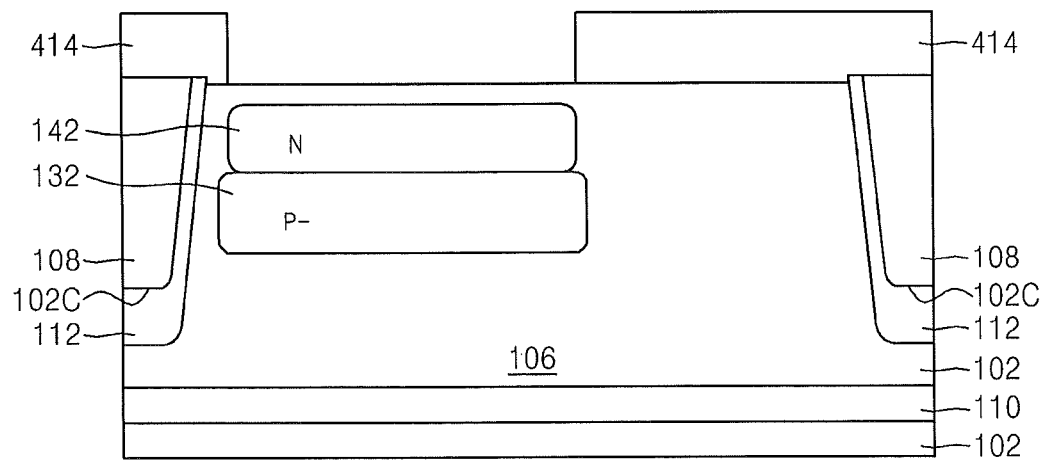

Referring to FIG. 4B, after the first mask 412 that is used in the process of FIG. 4A is removed, a second mask 414 is formed above the substrate 102. In one or more embodiments, the second mask 414 is formed of a photoresist layer. By using the second mask 414 as an ion injection mask, impurity ions are injected to the active region 106 of the substrate 102, so that an N-type second semiconductor region 142 is formed on the first semiconductor region 132.

Figure 4C:
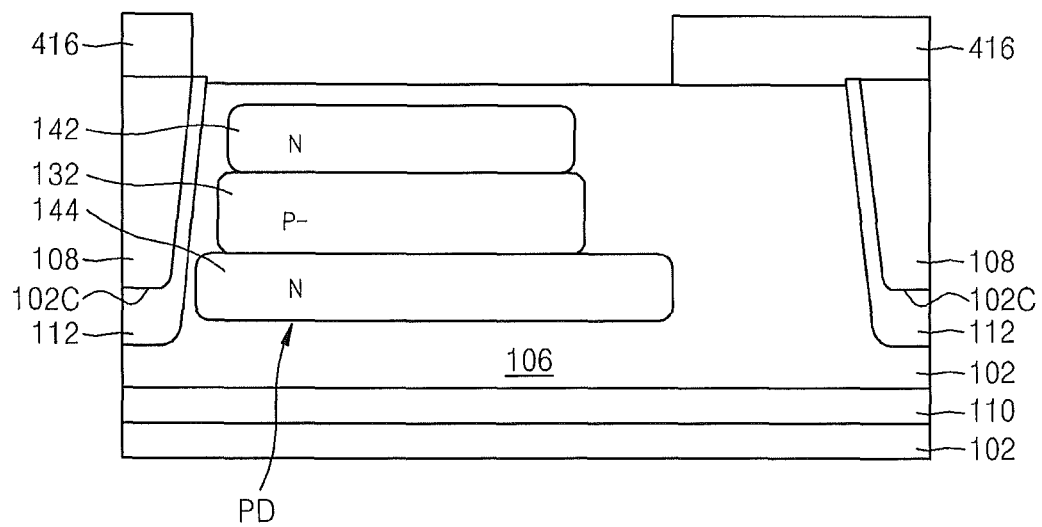

Referring to FIG. 4C, after the second mask 414 that is used in the process of FIG. 4B is removed, a third mask 416 is formed above the substrate 102. In one or more embodiments, the third mask 416 is formed of a photoresist layer. By using the third mask 416 as an ion injection mask, impurity ions are injected to the active region 106 of the substrate 102, so that an N-type second semiconductor region 144 having an interface with the first semiconductor region 132 at a lower side of the first semiconductor region 132 is formed. In other embodiments, a single mask may be used to form two or more of the semiconductor regions 142, 132 and/or 144.

In the present embodiment, the second semiconductor region 142 that is higher than the second semiconductor region 144 is first formed and then the second semiconductor region 144 that is lower than the second semiconductor region 142 is formed. However, a forming order is not limited thereto. That is, in other embodiments, the second semiconductor region 144 may be first formed according to the process of FIG. 4C, and then the second semiconductor region 142 may be formed according to the process of FIG. 4B.

Figure 4D:
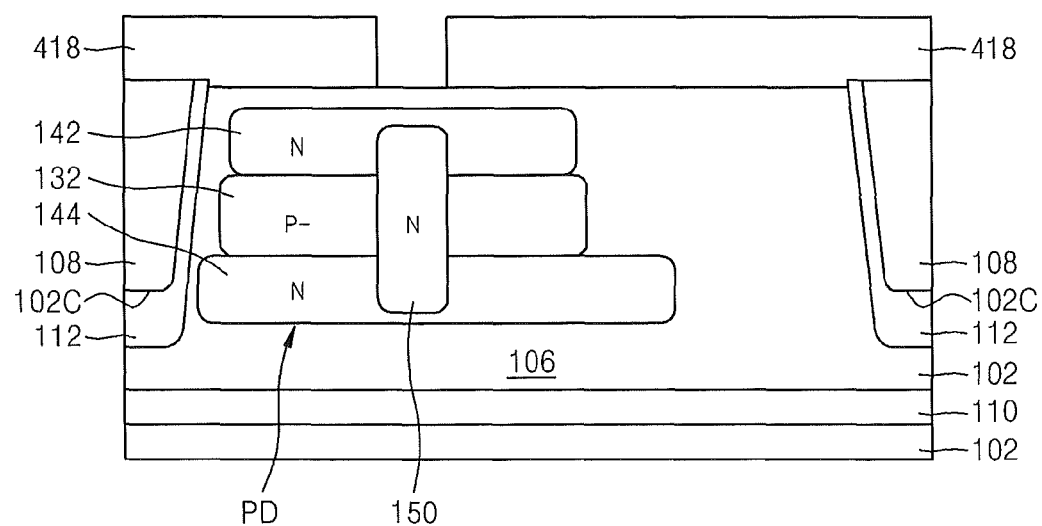

Referring to FIG. 4D, after the third mask 416 that is used in the process of FIG. 4C is removed, a fourth mask 418 is formed above the substrate 102. In one or more embodiments, the fourth mask 418 is formed of a photoresist layer. By using the fourth mask 418 as an ion injection mask, impurity ions are injected to the active region 106 of the substrate 102, so that an N-type color adjustment path area 150 that is connected between the second semiconductor regions 142 and 144 and penetrates through the first semiconductor region 132 is formed.

Figure 4E:
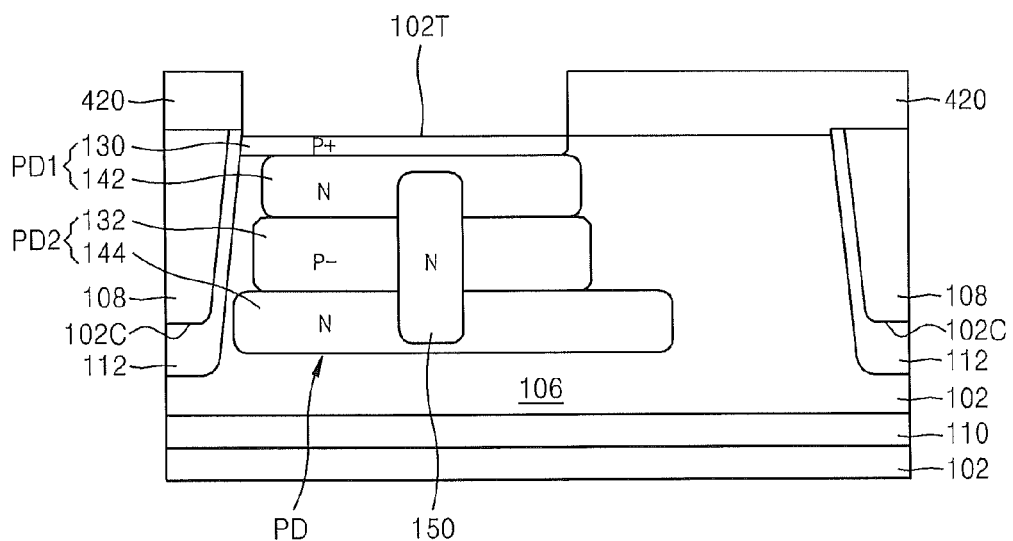

Referring to FIG. 4E, after the fourth mask 418 that is used in the process of FIG. 4D is removed, a fifth mask 420 is formed above the substrate 102. In one or more embodiments, the fifth mask 420 is formed of a photoresist layer. By using the fifth mask 420 as an ion injection mask, impurity ions are injected to the active region 106 of the substrate 102, so that a P+ type HAD region 130 that extends from a top surface 102T of the substrate 102 to a top surface of the second semiconductor region 142 in a depth direction of the substrate 102 is formed. The P+ type HAD region 130 is formed to have an interface with the top surface of the second semiconductor region 142. As a result, a photodiode PD, including a first photodiode region PD1 and a second photodiode region PD2, is formed. In other embodiments, a single mask may be used to form two or more of the semiconductor regions 130, 142, 132 and/or 144.

Figure 4F:
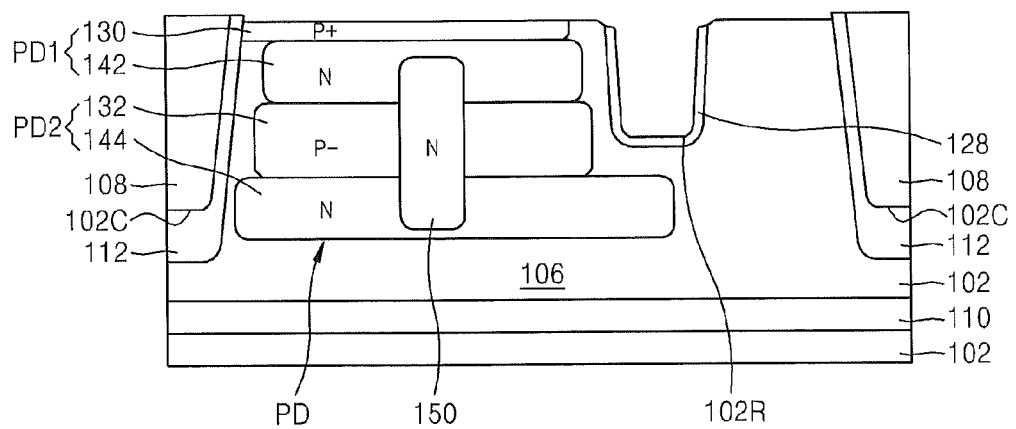

Referring to FIG. 4F, after the fifth mask 420 that is used in the process of FIG. 4E is removed, a channel impurity region 128 is formed by injecting impurity ions to a region in which a transfer transistor Tx is to be formed. The channel impurity region 128 may be doped with a P-type impurity. Afterward, a portion of the substrate 102 is etched so that a recess region 102R is formed.

In one or more embodiments, in order to form the recess region 102R to have rounded upper and lower corners, before the recess region 102R is formed, a trench for a gate (not shown) may be formed by etching a portion of the substrate 102 in the channel impurity region 128, a thermal oxide layer (not shown) may be formed on a sidewall and a bottom surface of the trench for a gate by performing a thermal oxidation process, and then the thermal oxide layer may be removed via a wet etching process. As a result, as illustrated in FIG. 4F, the recess region 102R may be formed having rounded upper and lower corners.

Figure 4G:
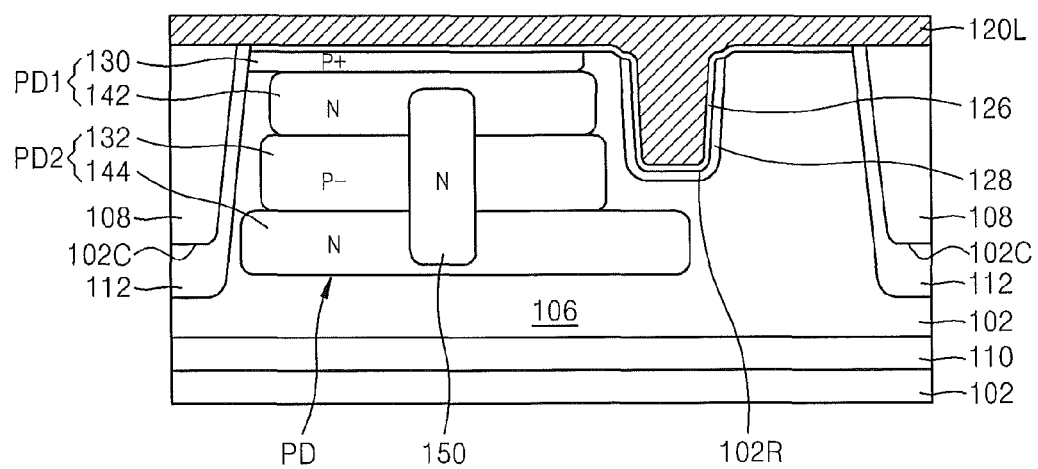

Referring to FIG. 4G, a gate insulating layer 126 is formed above the substrate 102, and a conductive layer 120L for forming a gate electrode 120 is formed on the gate insulating layer 126.

The gate insulating layer 126 is conformally formed above the substrate 102 along profiles of a sidewall and a bottom surface of the recess region 102R.

The conductive layer 120L is formed to fill an inside of the recess region 102R. The conductive layer 120L may be formed of doped polysilicon, metal, metal nitride, and/or metal silicide.

Figure 4H:
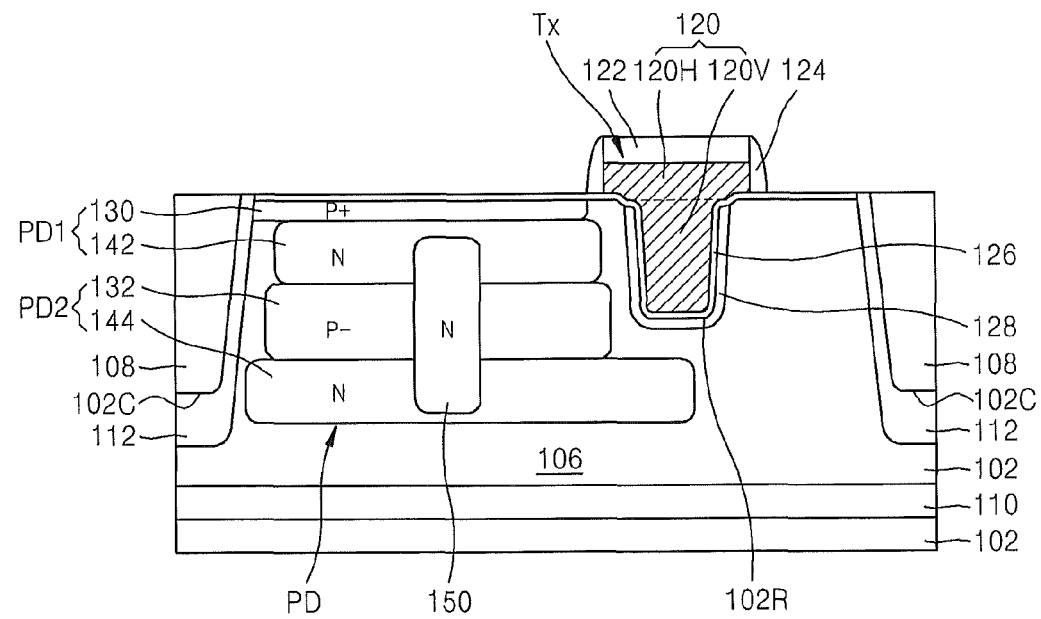

Referring to FIG. 4H, an insulating capping layer 122 is formed on the conductive layer 120L, and a portion of the conductive layer 120L is etched by using the insulating capping layer 122 as an etch mask, so that the gate electrode 120, including a vertical gate portion 120V and a horizontal gate portion 120H, is formed. Afterward, insulating spacers 124 that cover sidewalls of the gate electrode 120 are formed.

Figure 4I:
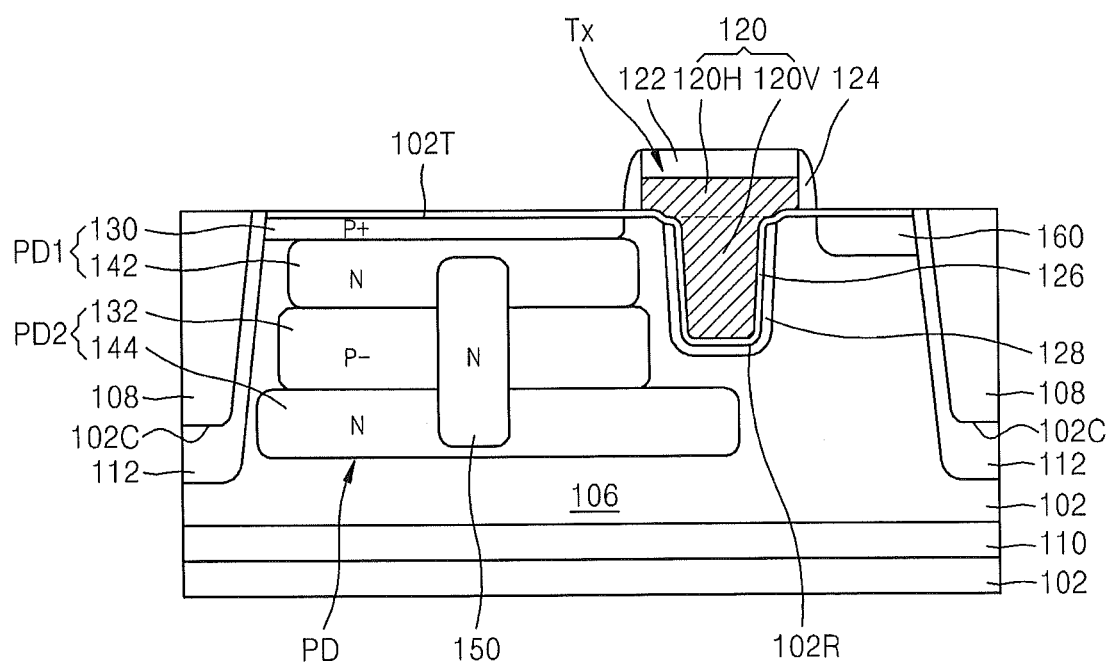

Referring to FIG. 4I, after a sixth mask (not shown) that covers the substrate 102 in a direction above the gate electrode 120 and the photodiode PD is formed, impurity ions are injected to the active region 106 of the substrate 102 by using the sixth mask as an ion injection mask, so that a floating diffusion region 160 having a predetermined thickness extending from the top surface 102T of the substrate 102 in the depth direction of the substrate 102 is formed. Afterward, the sixth mask is removed.

FIGS. 5A and 5B are diagrams illustrating an image sensor 200 according to another embodiment of the inventive concepts. In more detail, FIG. 5A is a layout of a unit pixel 204 of the image sensor 200, and FIG. 5B is a cross-sectional view of the unit pixel 204 of FIG. 5A, taken along a line 5B-5B'. The unit pixel 204 may be one of the unit pixels 22 of FIG. 1. In FIGS. 5A and 5B, like or similar members as those of FIGS. 1, 2, 3A, and 3B have like reference numerals, and thus, repeated descriptions thereof are omitted.

Referring to FIGS. 5A and 5B, the image sensor 200 includes a color adjustment path area 250. The color adjustment path area 250 provides a charge movement path, such as an electron movement path, between a first photodiode region PD1 and a second photodiode region PD2. The color adjustment path area 250 comprises a semiconductor area having the same conductivity type as second semiconductor regions 142 and 144 of a photodiode PD.

The color adjustment path area 250 is located at a position distant from surfaces of a substrate 102, e.g., surfaces of the substrate 102 in a recess region 102R and surfaces of the substrate 102 in a trench 102C.

The color adjustment path area 250 is located at a position that contacts a horizontal-direction edge PD_E (refer to FIG. 5A) of the photodiode PD, and is partially surrounded by the photodiode PD. The color adjustment path area 250 contacts an edge portion of the edge PD_E, wherein the edge is positioned farthest from a vertical gate portion 120V.

The color adjustment path area 250 is spaced apart from a device isolation region 108, and a portion of the color adjustment path area 250 contacts an impurity region 112 that surrounds the device isolation region 108. In other embodiments, the color adjustment path area 250 may be located at a position that is near the horizontal-direction edge PD_E of the photodiode PD and that does not contact the impurity region 112.

The color adjustment path area 250 is spaced apart from a transfer transistor Tx with the photodiode PD interposed therebetween. The color adjustment path area 250 vertically extends between the first photodiode region PD1 and the second photodiode region PD2.

The color adjustment path area 250 contacts each of the first semiconductor region 132 and the second semiconductor regions 142 and 144 at horizontal-direction edges of the first semiconductor region 132 and the second semiconductor regions 142 and 144. A portion of the color adjustment path area 250 extends from a position, which partially and horizontally overlaps with the vertical gate portion 120V, in a parallel direction to a vertical direction with respect to the vertical gate portion 120V. In FIG. 5B, the color adjustment path area 250 has an approximately straight pillar shape but a shape of the color adjustment path area 250 is not limited thereto. In other embodiments, the color adjustment path area 250 may have a shape different from a straight pillar shape.

When signal charges are accumulated in the photodiode PD, the color adjustment path area 250 is used as a charge movement path, such as an electron movement path, by which a charge amount that exceeds a FWC of one of the first photodiode region PD1 and the second photodiode region PD2 flows to the other one of the first photodiode region PD1 and the second photodiode region PD2.

Light that is incident to the photodiode PD on the top surface 102T or a bottom surface 102B of the substrate 102 is photoelectrically converted in the first photodiode region PD1 and the second photodiode region PD2, so that signal charges are generated. The generated signal charges are accumulated in the second semiconductor region 142 forming the first photodiode region PD1 or in the second semiconductor region 144 forming the second photodiode region PD2. When a FWC of one of the second semiconductor regions 142 and 144 is exceeded, charges that exceed the FWC may flow to the other one of the second semiconductor regions 142 and 144 via the color adjustment path area 250. After the signal charges are accumulated in the second semiconductor regions 142 and 144, when a predetermined voltage is applied to a gate electrode 120 of the transfer transistor Tx, the signal charges in the second semiconductor regions 142 and 144 and the color adjustment path area 250 may be transmitted to a floating diffusion region 160 via first through third channel regions CH1, CH2, and CH3.

The image sensor 200 includes the first photodiode region PD1 and the second photodiode region PD2 that vertically overlap with each other along the depth direction of the substrate 102, and the color adjustment path area 250 that provides an electron movement path between the first photodiode region PD1 and the second photodiode region PD2, so that the image sensor 200 may increase an FWC in the first photodiode region PD1 and the second photodiode region PD2. Thus, although a size of a unit pixel of the image sensor 200 becomes minute, an FWC in the photodiode PD may be increased and excellent sensitivity and color quality may be achieved.

Figure 6A:
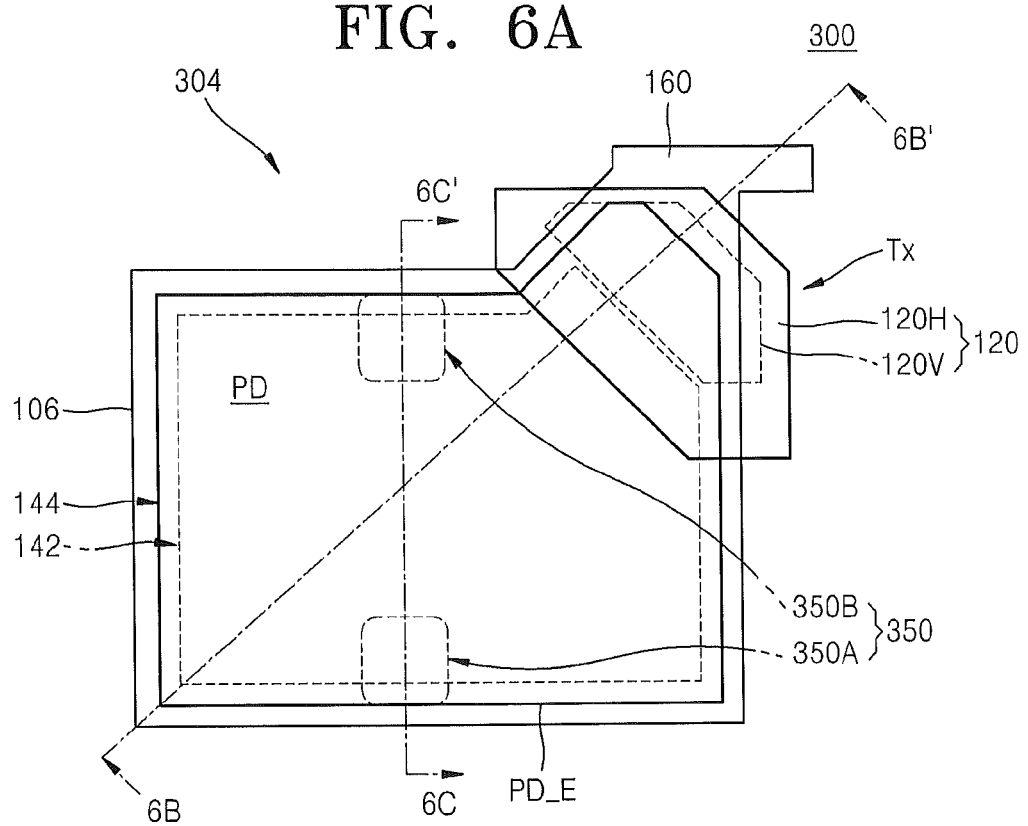
FIG. 6A is a layout of a unit pixel of an image sensor according to another embodiment of the inventive concepts.
Figure 6B:
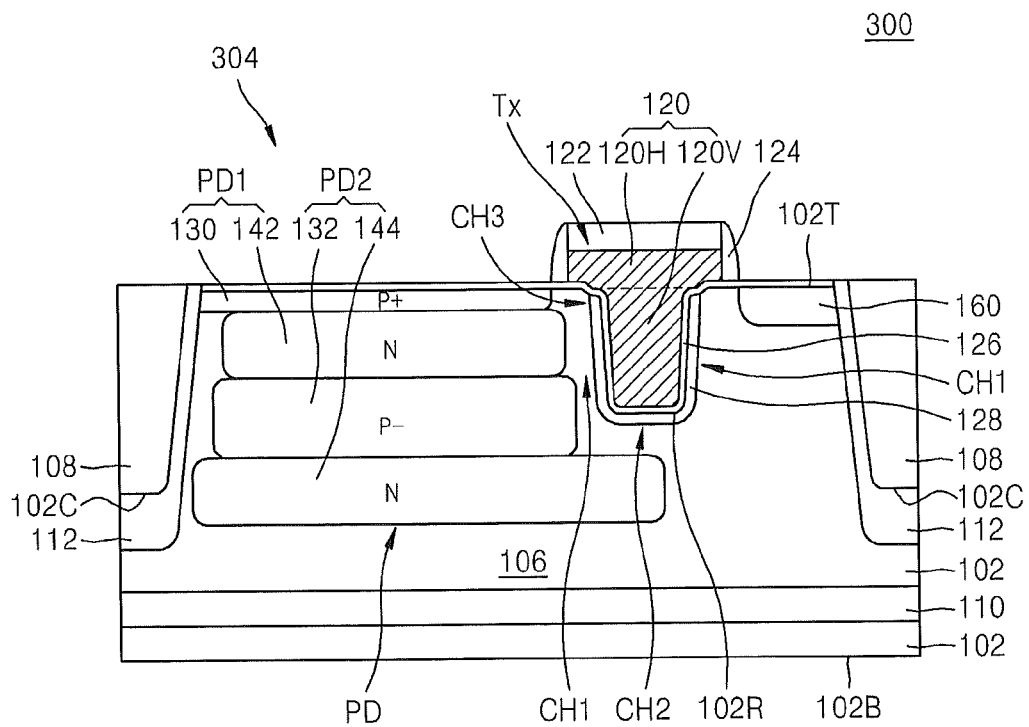
FIG. 6B is a cross-sectional view of the unit pixel of FIG. 6A, taken along a line 6B-6B'.
Figure 6C:
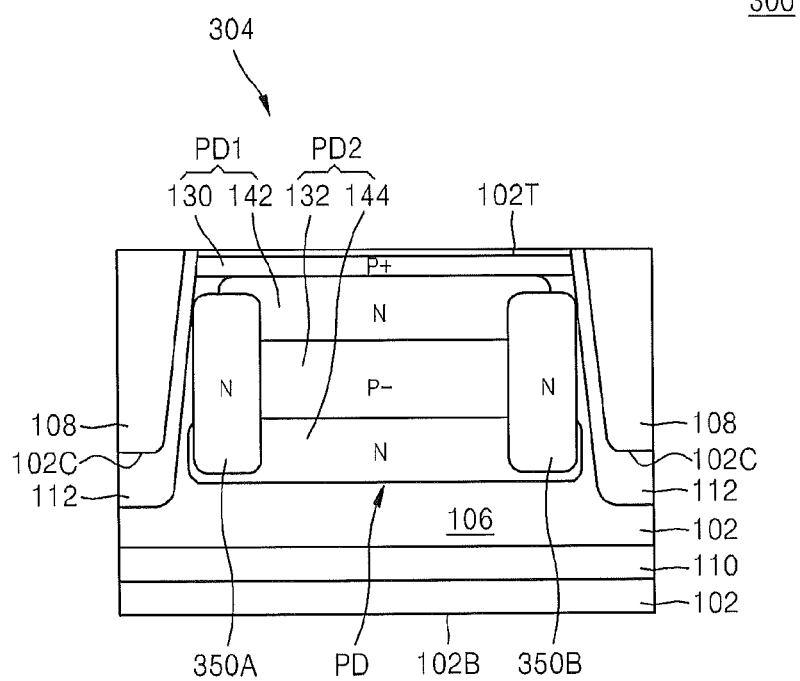
FIG. 6C is a cross-sectional view of the unit pixel of FIG. 6A, taken along a line 6C-6C'.

FIGS. 6A through 6C are diagrams illustrating an image sensor 300 according to another embodiment of the inventive concepts. In more detail, FIG. 6A is a layout of a unit pixel 304 of the image sensor 300, FIG. 6B is a cross-sectional view of the unit pixel 304 of FIG. 6A, taken along a line 6B-6B', and FIG. 6C is a cross-sectional view of the unit pixel 304 of FIG. 6A, taken along a line 6C-6C'. The unit pixel 304 may be one of the unit pixels 22 of FIG. 1. In FIGS. 6A through 6C, like or similar members as those of FIGS. 1, 2, 3A, and 3B have like reference numerals, and thus, repeated descriptions thereof are omitted.

Referring to FIGS. 6A through 6C, the image sensor 300 includes a plurality of color adjustment path areas 350. For example, the color adjustment path areas 350 include a first color adjustment path area 350A and a second color adjustment path area 350B that are spaced apart each other by a predetermined distance.

Each of the first color adjustment path area 350A and the second color adjustment path area 350B provides a charge movement path, such as an electron movement path, between a first photodiode region PD1 and a second photodiode region PD2. The first color adjustment path area 350A and the second color adjustment path area 350B comprise semiconductor areas having the same conductivity type as second semiconductor regions 142 and 144 of a photodiode PD.

Each of the first color adjustment path area 350A and the second color adjustment path area 350B is located at a position distant from surfaces of a substrate 102, e.g., surfaces of the substrate 102 in a recess region 102R and surfaces of the substrate 102 in a trench 102C.

Each of the first color adjustment path area 350A and the second color adjustment path area 350B is located at the position that contacts a horizontal-direction edge PD_E of the photodiode PD, and is partially surrounded by the photodiode PD.

A portion of each of the first color adjustment path area 350A and a portion of the second color adjustment path area 350B contact an impurity region 112. In other embodiments, at least one of the first color adjustment path area 350A and the second color adjustment path area 350B may be located at a position that contacts the horizontal-direction edge PD_E of the photodiode PD and that does not contact the impurity region 112.

Each of the first color adjustment path area 350A and the second color adjustment path area 350B is spaced apart from a transfer transistor Tx with the photodiode PD interposed therebetween. Each of the first color adjustment path area 350A and the second color adjustment path area 350B vertically extends between the first photodiode region PD1 and the second photodiode region PD2.

Each of the first color adjustment path area 350A and the second color adjustment path area 350B contacts the first semiconductor region 132 and the second semiconductor regions 142 and 144 at horizontal-direction edges of the first semiconductor region 132 and the second semiconductor regions 142 and 144. Each of the first color adjustment path area 350A and the second color adjustment path area 350B has a straight pillar shape extending from a position, which partially and horizontally overlaps with the vertical gate portion 120V, in a parallel direction to a vertical direction with respect to the vertical gate portion 120V. In FIG. 6C, each of the first color adjustment path area 350A and the second color adjustment path area 350B has a straight pillar shape but shapes of the first color adjustment path area 350A and the second color adjustment path area 350B are not limited thereto. In other embodiments, the first color adjustment path area 350A and the second color adjustment path area 350B may have a shape different from a straight pillar shape.

FIG. 6C illustrates an example in which the first color adjustment path area 350A and the second color adjustment path area 350B have the same depth and are at the same levels. However, in other embodiments, the first color adjustment path area 350A and the second color adjustment path area 350B may be formed at different levels. Also, in other embodiments, the first color adjustment path area 350A and the second color adjustment path area 350B may have different depths in a depth direction of the substrate 102.

When signal charges are accumulated in the photodiode PD, each of the first color adjustment path area 350A and the second color adjustment path area 350B is used as a charge movement path, such as an electron movement path, by which a charge amount that exceeds a FWC of one of the first photodiode region PD1 and the second photodiode region PD2 flows to the other one of the first photodiode region PD1 and the second photodiode region PD2.

Light that is incident to the photodiode PD on the top surface 102T or a bottom surface 102B of the substrate 102 is photoelectrically converted in the first photodiode region PD1 and the second photodiode region PD2, so that signal charges are generated. The generated signal charges are accumulated in the second semiconductor region 142 forming the first photodiode region PD1 or in the second semiconductor region 144 forming the second photodiode region PD2. When a FWC of one of the second semiconductor regions 142 and 144 is exceeded, charges that exceed the FWC may flow to the other one of the second semiconductor regions 142 and 144 via at least one of the first color adjustment path area 350A and the second color adjustment path area 350B. After the signal charges are accumulated in the second semiconductor regions 142 and 144, when a predetermined voltage is applied to a gate electrode 120 of the transfer transistor Tx, the signal charges in the second semiconductor regions 142 and 144 and the first color adjustment path area 350A and the second color adjustment path area 350B may be transmitted to a floating diffusion region 160 via first through third channel regions CH1, CH2, and CH3.

The image sensor 300 includes the first photodiode region PD1 and the second photodiode region PD2 that vertically overlap with each other along the depth direction of the substrate 102, and the first color adjustment path area 350A and the second color adjustment path area 350B that provide an electron movement path between the first photodiode region PD1 and the second photodiode region PD2, so that the image sensor 300 may increase an FWC in the first photodiode region PD1 and the second photodiode region PD2. Thus, although a size of a unit pixel of the image sensor 300 becomes minute, an FWC in the photodiode PD may be increased and excellent sensitivity and color quality may be achieved.

Figure 7:
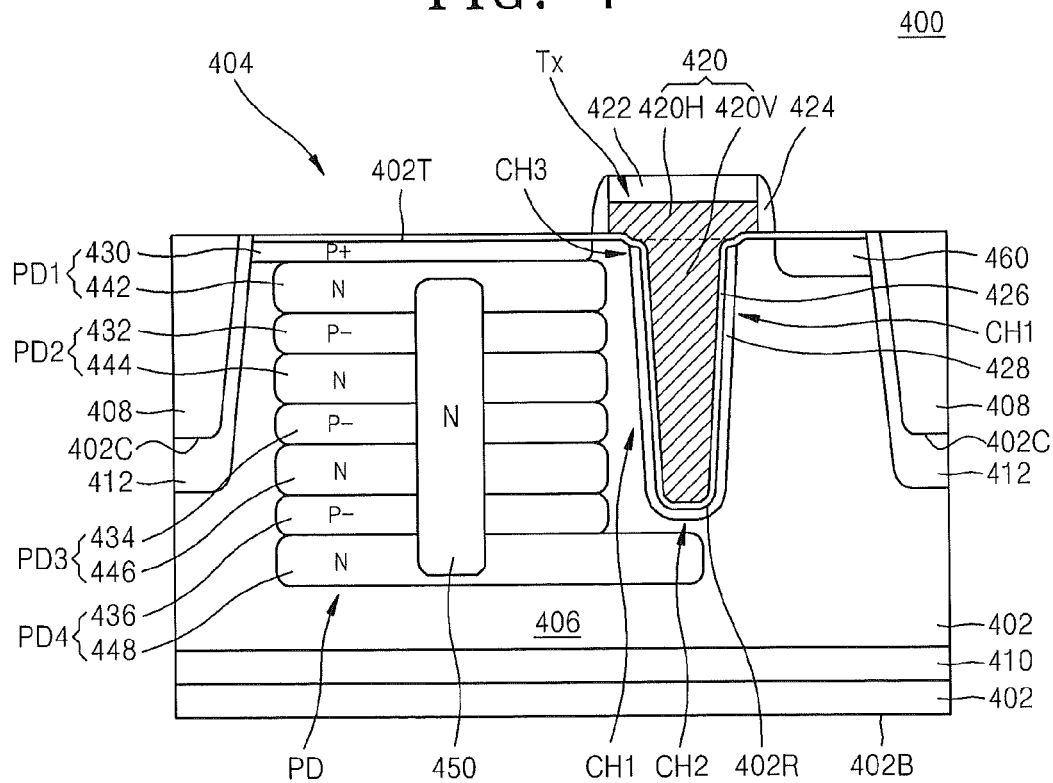
FIG. 7 is a cross-sectional view of a unit pixel of an image sensor according to another embodiment of the inventive concepts.

FIG. 7 is a cross-sectional view of a unit pixel 404 of an image sensor 400 according to another embodiment of the inventive concepts. The unit pixel 404 may be one of the unit pixels 22 of FIG. 1. In FIG. 7, like or similar members as those of FIGS. 1, 2, 3A, and 3B have like reference numerals, and thus, repeated descriptions thereof are omitted. For example, a member with reference numeral "4xx" in FIG. 7 indicates like or similar member as a member with reference numeral "1xx" in FIGS. 3A and 3B. Thus, in order to avoid redundancy, repeated descriptions thereof are omitted here.

Referring to FIG. 7, in the unit pixel 404 of the image sensor 400, a photodiode PD, including first, second, third, and fourth photodiode regions PD1, PD2, PD3, and PD4 that are sequentially provided from a top surface 402T of a substrate 402 in a depth direction of the substrate 402, is provided in an active region 406 of the substrate 402.

The photodiode PD includes three first semiconductor regions 432, 434, and 436 and four second semiconductor regions 442, 444, 446, and 448, which are alternately disposed one-by-one in a vertical direction. The first semiconductor regions 432, 434, and 436 are formed as P-type impurity regions, and the second semiconductor regions 442, 444, 446, and 448 are formed as N-type impurity regions.

The first photodiode region PD1 includes an interface or junction between the second semiconductor region 442 and an HAD region 430. The second photodiode region PD2 includes an interface between the second semiconductor region 444 and the first semiconductor region 432. The third photodiode region PD3 includes an interface between the second semiconductor region 446 and the first semiconductor region 434. The fourth photodiode region PD4 includes an interface between the second semiconductor region 448 and the first semiconductor region 436.

The second semiconductor region 448 that forms the fourth photodiode region PD4 faces a bottom surface of a vertical gate portion 420V with a second channel region CH2 interposed therebetween.

The first through fourth photodiode regions PD1, PD2, PD3, and PD4 vertically overlap with each other.

A depth of each of the first through fourth photodiode regions PD1, PD2, PD3, and PD4 may correspond to a transmittance depth of each of wavelengths of light incident to the substrate 402, i.e., the depth of each of the first through fourth photodiode regions PD1, PD2, PD3, and PD4 may correspond to a depth at which an intensity of light having a particular wavelength is highest in the substrate 402. For example, in a case of a front-side illumination type image sensor in which light is incident on the top surface 402T of the substrate 402, the first photodiode region PD1 may be disposed to correspond to a transmittance depth of blue (B) light having a relatively short wavelength. The second photodiode region PD2 may be disposed to correspond to a transmittance depth of green (G) light. The third photodiode region PD3 may be disposed to correspond to a transmittance depth of red (R) light. The fourth photodiode region PD4 may be disposed to correspond to a transmittance depth of infrared rays. By disposing the first through fourth photodiode regions PD1, PD2, PD3, and PD4 at different depths in the substrate 402, color separation may be possible according to a depth of the substrate 402, and an image sensor for a three-dimensional (3D) image may be embodied. As another embodiment, a backside illumination type image sensor in which light is incident on a bottom surface 402B of the substrate 402 may have a similar configuration as a configuration of the front-side illumination type image sensor. However, in a case of the backside illumination type image sensor, types of colors separated in the first through fourth photodiode regions PD1, PD2, PD3, and PD4 are determined according to transmittance depths from the bottom surface 402B of the substrate 402.

The image sensor 400 includes a color adjustment path area 450. The color adjustment path area 450 provides a charge movement path, such as an electron movement path, between the first through fourth photodiode regions PD1, PD2, PD3, and PD4. The color adjustment path area 450 is provided as a semiconductor area having the same conductivity type as the second semiconductor regions 442, 444, 446, and 448 of the photodiode PD.

When signal charges are accumulated in the photodiode PD, the color adjustment path area 450 is used as an electron movement path by which a charge amount that exceeds a FWC of some of the first through fourth photodiode regions PD1, PD2, PD3, and PD4 flows to the other first through fourth photodiode regions PD1, PD2, PD3, and PD4.

A detailed configuration of the color adjustment path area 450 is referred to by the features of the color adjustment path area 150 described above with reference to FIGS. 3A and 3B.

In order to form the image sensor 400 of FIG. 7, processes that are similar to the processes of the method described above with reference to FIGS. 4A through 4I may be performed. However, in order to form the photodiode PD including the first through fourth photodiode regions PD1, PD2, PD3, and PD4, the three first semiconductor regions 432, 434, and 436 are sequentially formed in a similar manner to the process of FIG. 4B that is related to forming the first semiconductor region 132. Ion injection processes to form the three first semiconductor regions 432, 434, and 436 may be performed by using the same ion injection mask. Alternatively, different masks may be used. Then, similarly to the processes of FIGS. 4B and 4C that are related to forming the second semiconductor regions 142 and 144, the four second semiconductor regions 442, 444, 446, and 448 are sequentially formed. In one or more embodiments, ion injection processes to form some of the four second semiconductor regions 442, 444, 446, and 448, e.g., the three second semiconductor regions 442, 444, and 446 may be performed by using the same ion injection mask. Alternatively, different masks may be used. Afterward, similarly to the process of FIG. 4D that is related to forming the color adjustment path area 150, the color adjustment path area 450 is formed.

FIG. 7 illustrates an example in which the color adjustment path area 450 is embodied in a straight pillar shape extending from the second semiconductor region 442, which among the four second semiconductor regions 442, 444, 446, and 448 is closer to the top surface 402T of the substrate 402, to the second semiconductor region 448, which among the four second semiconductor regions 442, 444, 446, and 448 is closer to the bottom surface 402B of the substrate 402. However, one or more embodiments of the inventive concepts are not limited thereto. For example, the color adjustment path area 450 may have one of various shapes different from the straight pillar shape. In other embodiments, the image sensor 400 may include a plurality of color adjustment path areas (not shown) comprising a plurality of impurity areas positioned at different depths from the top surface 402T of the substrate 402, instead of including the color adjustment path area 450.

FIG. 8 is a cross-sectional view of a unit pixel 504 of an image sensor 500 according to another embodiment of the inventive concepts. The unit pixel 504 may be one of the unit pixels 22 of FIG. 1. In FIG. 8, like or similar members as those of FIGS. 1 through 7 have like reference numerals, and thus, repeated descriptions thereof are omitted.

Referring to FIG. 8, the image sensor 500 includes a photodiode PD having first, second, third, and fourth photodiode regions PD1, PD2, PD3, and PD4 that are sequentially located from a top surface 402T of a substrate 402 in a depth direction of the substrate 402. The image sensor 500 includes a color adjustment path area 550. The color adjustment path area 550 provides a charge movement path, such as an electron movement path, between the first through fourth photodiode regions PD1, PD2, PD3, and PD4. The color adjustment path area 550 is embodied as a semiconductor area having the same conductivity type as the second semiconductor regions 442, 444, 446, and 448 of the photodiode PD.

When signal charges are accumulated in the photodiode PD, the color adjustment path area 550 is used as an electron movement path by which a charge amount that exceeds a FWC of some of the first through fourth photodiode regions PD1, PD2, PD3, and PD4 flows to other regions of the first through fourth photodiode regions PD1, PD2, PD3, and PD4.

A detailed configuration of the color adjustment path area 550 is referred to by the features of the color adjustment path area 250 described above with reference to FIGS. 5A and 5B.

FIG. 8 illustrates an example in which the color adjustment path area 550 has an approximately straight pillar shape that contacts a horizontal-direction edge of the photodiode PD, which is positioned farthest from a vertical gate portion 420V, and that extends from the second semiconductor region 442, which among the second semiconductor regions 442, 444, 446, and 448 is closest to the top surface 402T of the substrate 402, to the second semiconductor region 448, which among the second semiconductor regions 442, 444, 446, and 448 is closest to a bottom surface 402B of the substrate 402. However, one or more embodiments of the inventive concepts are not limited thereto. For example, the color adjustment path area 550 may have one of various shapes different from the straight pillar shape. In other embodiments, the image sensor 500 may include a plurality of color adjustment path areas (not shown) provided as a plurality of impurity areas positioned at different depths from the top surface 402T of the substrate 402, instead of including the color adjustment path area 550 provided as one impurity area, as shown in FIG. 8.

Figure 9A:
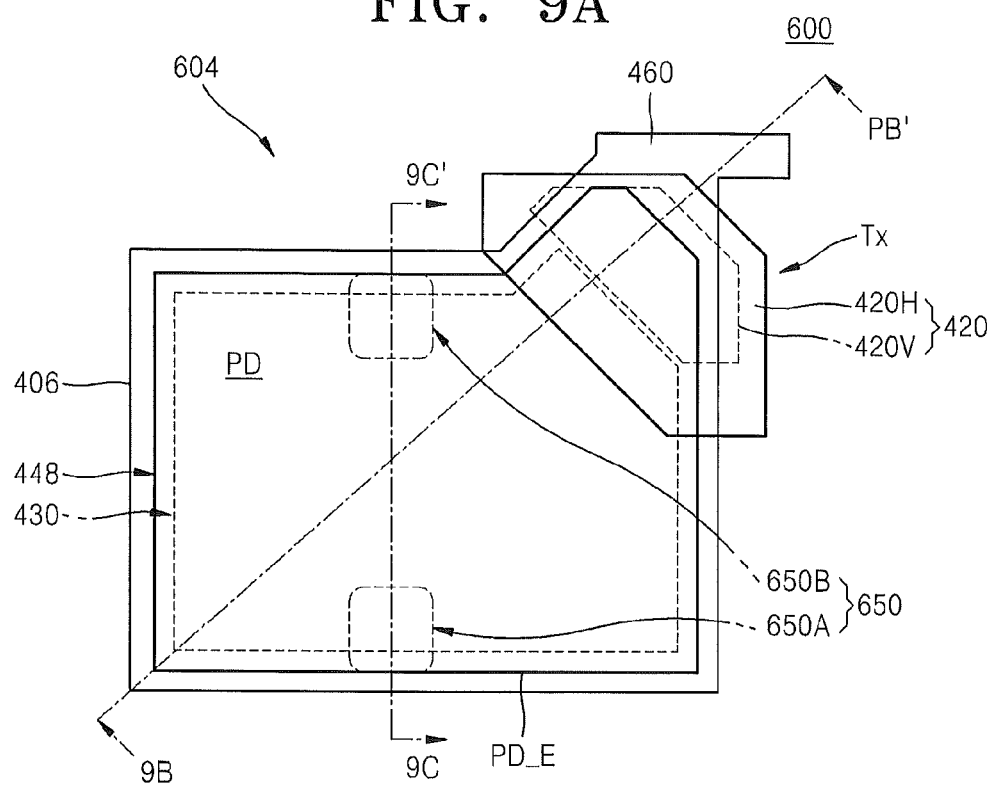
FIG. 9A is a layout of a unit pixel of an image sensor according to another embodiment of the inventive concepts.
Figure 9B:
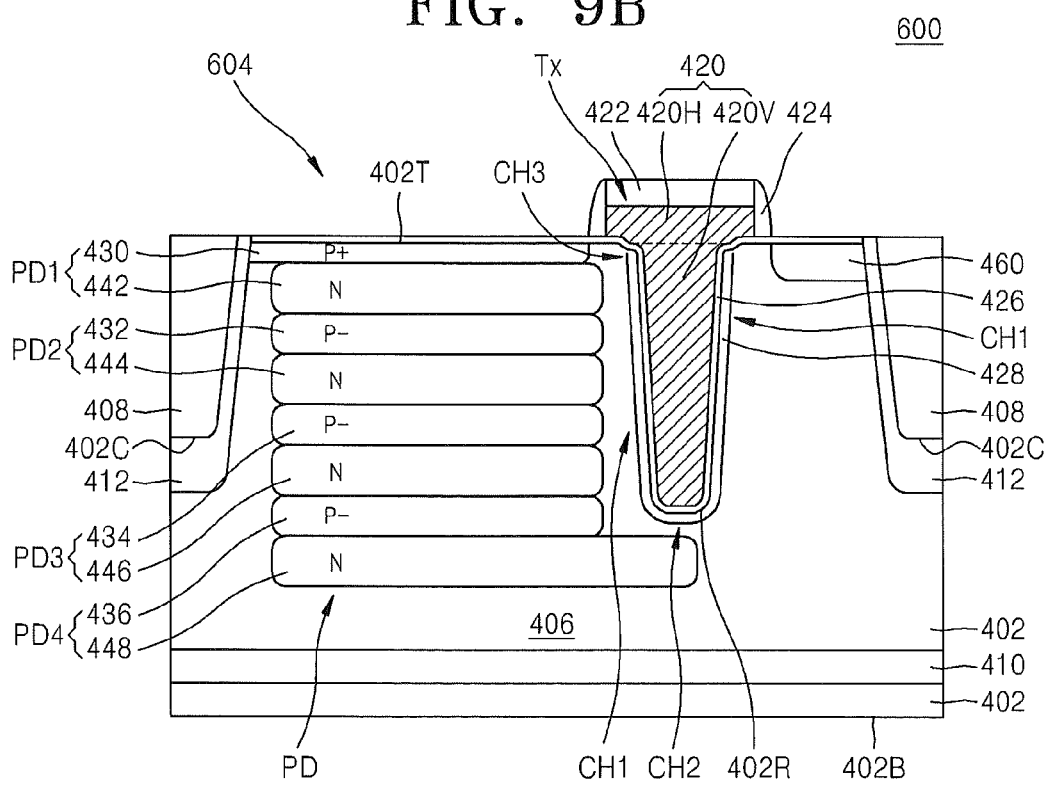
FIG. 9B is a cross-sectional view of the unit pixel of FIG. 9A, taken along a line 9B-9B'.
Figure 9C:
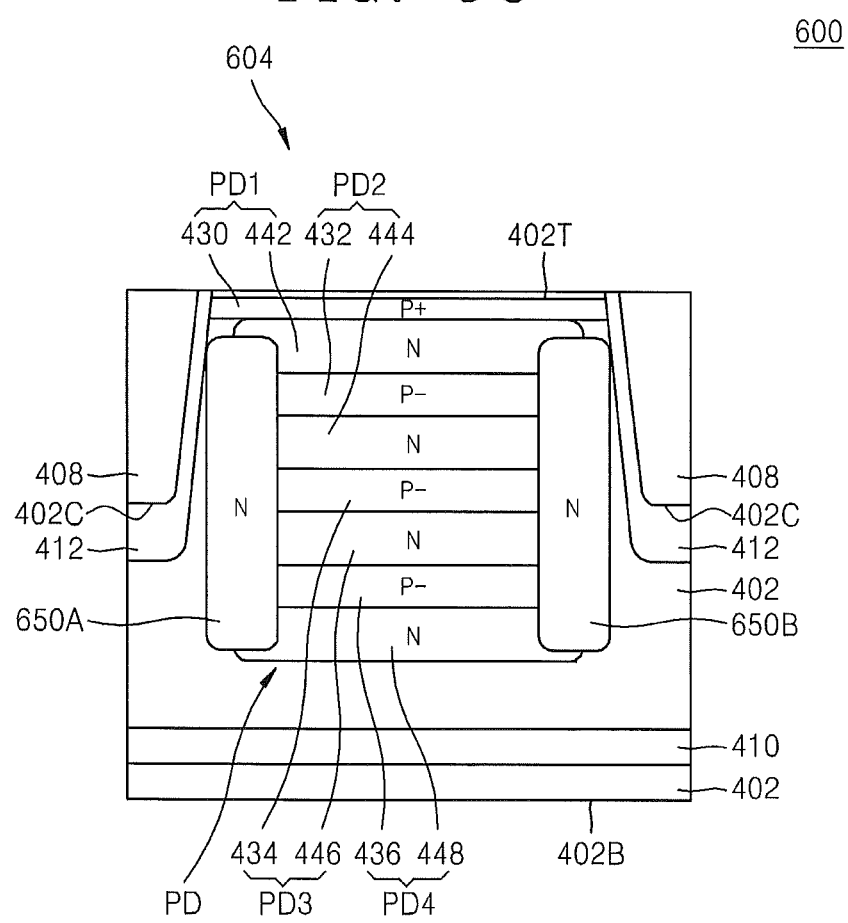
FIG. 9C is a cross-sectional view of the unit pixel of FIG. 9A, taken along a line 9C-9C'.

FIGS. 9A through 9C are diagrams illustrating an image sensor 600 according to another embodiment of the inventive concepts. In more detail, FIG. 9A is a layout of a unit pixel 604 of the image sensor 600, FIG. 9B is a cross-sectional view of the unit pixel 604 of FIG. 9A, taken along a line 9B-9B', and FIG. 9C is a cross-sectional view of the unit pixel 604 of FIG. 9A, taken along a line 9C-9C'. The unit pixel 604 may be one of the unit pixels 22 of FIG. 1. In FIGS. 9A through 9C, like or similar members as those of FIGS. 1 through 8 have like reference numerals, and thus, repeated descriptions thereof are omitted.

Referring to FIGS. 9A through 9C, the image sensor 600 includes a photodiode PD having first, second, third, and fourth photodiode regions PD1, PD2, PD3, and PD4 that are sequentially provided from a top surface 402T of a substrate 402 in a depth direction of the substrate 402. Also, the image sensor 600 includes a plurality of color adjustment path areas 650. The color adjustment path areas 650 include a first color adjustment path area 650A and a second color adjustment path area 650B that are separated from each other by a predetermined distance.

Each of the first color adjustment path area 650A and the second color adjustment path area 650B provides a charge movement path, such as an electron movement path, between the first through fourth photodiode regions PD1, PD2, PD3, and PD4. The first color adjustment path area 650A and the second color adjustment path area 650B are embodied as semiconductor areas having the same conductivity type as second semiconductor regions 442, 444, 446, and 448 of the photodiode PD.

When signal charges are accumulated in the photodiode PD, each of the first color adjustment path area 650A and the second color adjustment path area 650B is used as a charge movement path, such as an electron movement path, by which a charge amount that exceeds a FWC of some of the first through fourth photodiode regions PD1, PD2, PD3, and PD4 flows to other regions of the first through fourth photodiode regions PD1, PD2, PD3, and PD4.

Detailed configurations of the first color adjustment path area 650A and the second color adjustment path area 650B are referred to by the features of the first color adjustment path area 350A and the second color adjustment path area 350B described above with reference to FIGS. 6A through 6C.

Figure 10:
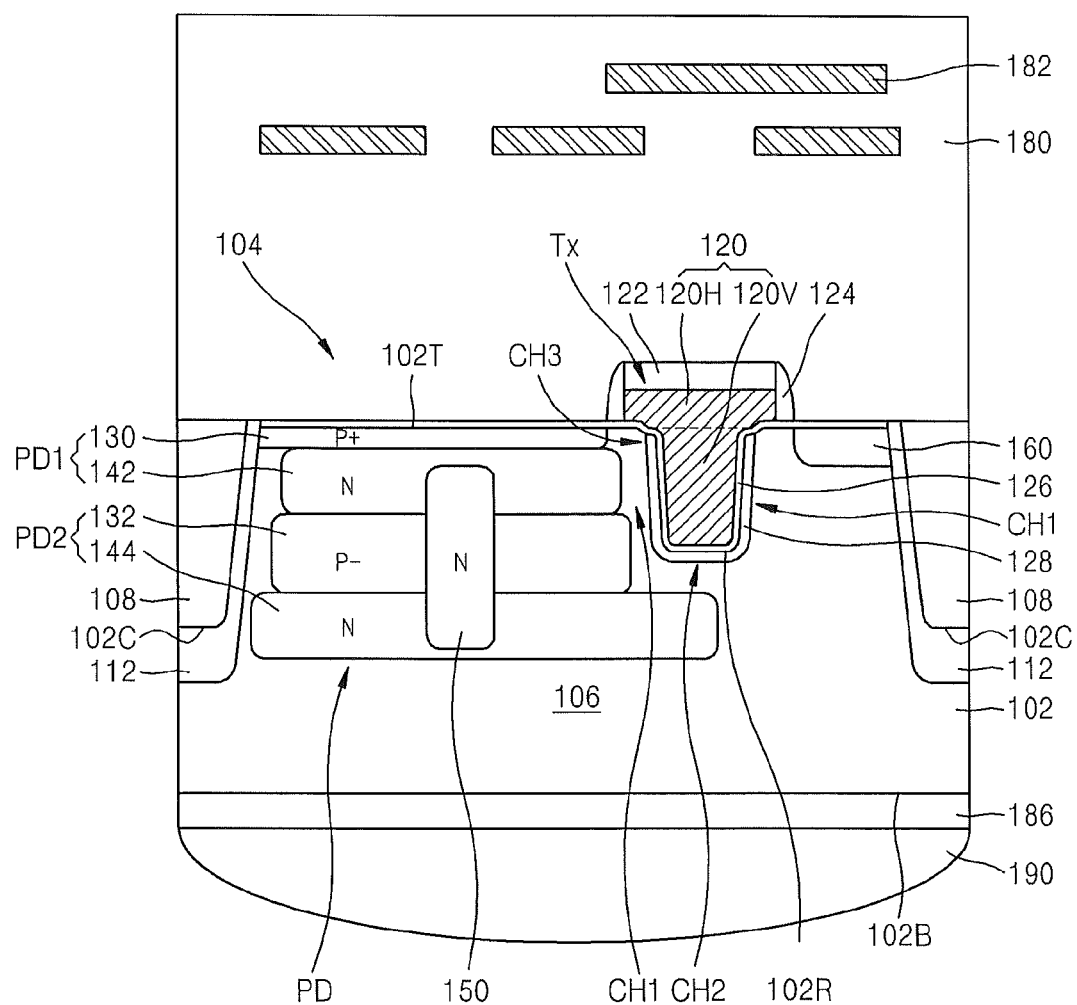
FIG. 10 is a cross-sectional view of an image sensor that is a backside illumination type image sensor according to another embodiment of the inventive concepts.

FIG. 10 is a cross-sectional view of an image sensor 700 that is a backside illumination type image sensor according to another embodiment of the inventive concepts. In FIG. 10, like members as those of FIG. 3B denote like reference numerals, and thus, repeated descriptions thereof are omitted here.

Referring to FIG. 10, the image sensor 700 includes an interlayer insulating layer 180 that is on, and in some embodiments covers, a substrate 102 and a transfer transistor Tx in a direction above a top surface 102T of the substrate 102. In the interlayer insulating layer 180, a plurality of wiring layers 182 are provided. The wiring layers 182 may be electrically connected to a gate electrode 120 of the transfer transistor Tx. The interlayer insulating layer 180 may be provided as a multi-layer structure in which a plurality of insulating layers are stacked.

The image sensor 700 further includes a color filter 186 that is on, and in some embodiments covers, the substrate 102 in a direction below a bottom surface 102B of the substrate 102, and a micro-lens 190 that is on the color filter 186. In one or more embodiments, the color filter 186 may be one of R, G, and B colors. In other embodiments, at least one of a planarization layer (not shown), a reflection prevention layer (not shown), and a passivation layer (not shown) may be further arranged between the bottom surface 102B of the substrate 102 and the color filter 186.

FIG. 10 illustrates an example of a backside illumination type image sensor in which light is incident from the bottom surface 102B of the substrate 102 to the inside of the substrate 102, but one or more embodiments of the inventive concepts are not limited thereto. Although not illustrated, in a case of a front-side illumination type image sensor in which a color filter and a micro-lens are arranged on the top surface 102T of the substrate 102, and light is incident from the top surface 102T of the substrate 102 to the inside of the substrate 102, the front-side illumination type image sensor may similarly include the image sensor 700 having a color adjustment path area 150, as shown in FIG. 10.

FIG. 10 illustrates the example of the backside illumination type image sensor using a structure of the image sensor 700 including the color adjustment path area 150 of FIG. 3B, but one or more embodiments of the inventive concepts are not limited thereto. In other embodiments, the image sensor 700 may be at least one of the image sensors 100A, 200, 300, 400, 500, and 600, each including at least one of the color adjustment path areas 150A, 250, 350, 450, 550, and 650.

Figure 11:
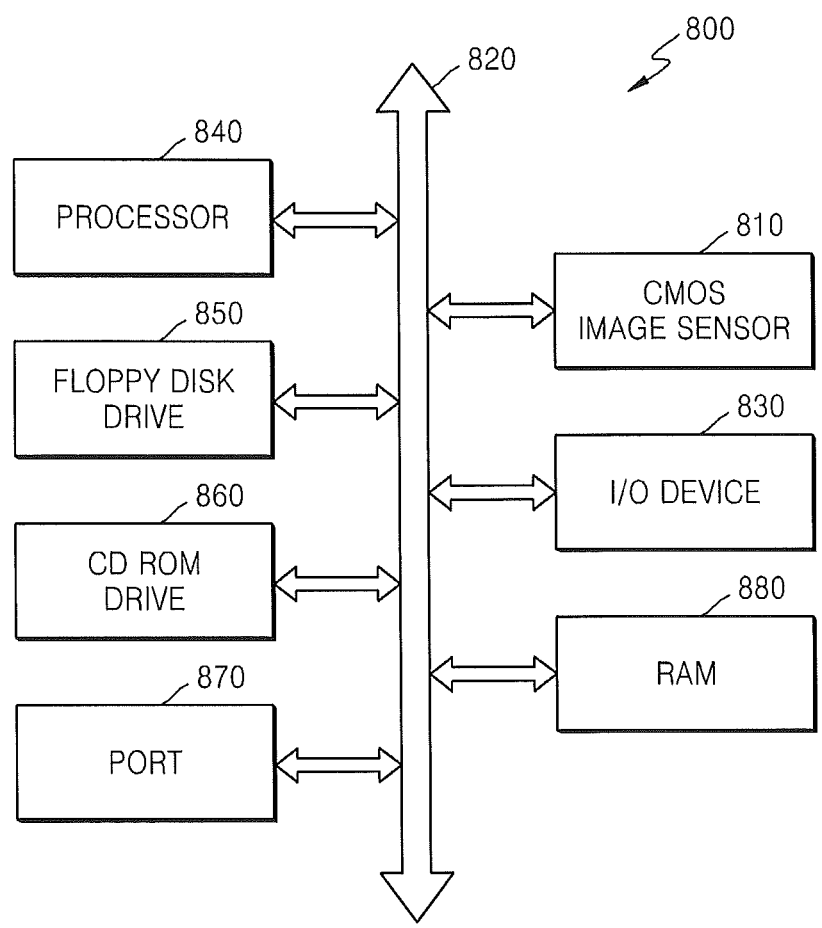
FIG. 11 is a block diagram of an imaging system including an image sensor, according to an embodiment of the inventive concepts.

FIG. 11 is a block diagram of an imaging system 800 including an image sensor, according to an embodiment of the inventive concepts.

Referring to FIG. 11, the imaging system 800 processes an output image of a CMOS image sensor 810.

The imaging system 800 includes a processor 840 capable of receiving/transmitting data from/to an input/output (I/O) device 830 via a bus 820. In one or more embodiments, the processor 840 is embodied as a microprocessor or a central processing unit (CPU). In the imaging system 800, the processor 840 may exchange data with a floppy disk drive (FDD) 850, a compact disk read-only memory (CD ROM) drive 860 and/or another disk drive, a port 870, and/or a random-access memory (RAM) 880 via the bus 820, and may reproduce an image with respect to data, which is output from the CMOS image sensor 810.

The port 870 may couple a video card, a sound card, a memory card, a universal serial bus (USB) and/or the like, and/or may perform data communication with another system. In one or more embodiments, the CMOS image sensor 810 and the processor 840 may be integrated together. In some embodiments, the CMOS image sensor 810 and the RAM 880 may be integrated together. Alternatively, the CMOS image sensor 810 and the processor 840 may be separate chips.

The imaging system 800 includes at least one of the image sensors 100, 100A, 200, 300, 400, 500, and 600 described above with reference to FIGS. 1 through 9C.

The imaging system 800 may be applied to various devices including digital cameras, camcorders, personal communication systems (PCSs), game players, security cameras, medial micro-cameras, robots, or the like.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While the inventive concepts have been particularly shown and described with reference to exemplary embodiments thereof, it will be understood that various changes in form and details may be made therein without departing from the spirit and scope of the following claims.

What is claimed is:

1. An image sensor comprising:
   a device isolation region defining an active region in a unit pixel of a substrate;
   a transfer transistor comprising a vertical gate portion extending from a top surface of the substrate in a depth direction of the substrate in the active region, and a channel region vertically extending along sidewalls of the vertical gate portion in the active region;
   a plurality of photodiode regions located at positions of different depths with respect to the top surface of the substrate in the active region; and
   at least one color adjustment path area located at a position spaced apart from the channel region, the at least one color adjustment path area extending between at least two photodiode regions of the plurality of photodiode regions, and providing a charge movement path between the at least two photodiode regions.

2. The image sensor of claim 1, wherein the at least one color adjustment path area is located at a position spaced apart from the device isolation region.

3. The image sensor of claim 1, wherein the at least one color adjustment path area comprises a color adjustment path area that penetrates through the plurality of photodiode regions so as to be surrounded by the plurality of photodiode regions.

4. The image sensor of claim 1, wherein the at least one color adjustment path area comprises an inner color adjustment path area located at a position spaced apart from a horizontal-direction edge of at least one of the plurality of photodiode regions, and surrounded by the plurality of photodiode regions.

5. The image sensor of claim 1, wherein the at least one color adjustment path area comprises at least one edge-side color adjustment path area located at a position contacting a horizontal-direction edge of at least one of the plurality of photodiode regions, and partially surrounded by the plurality of photodiode regions.

6. The image sensor of claim 5, wherein the at least one edge-side color adjustment path area contacts a portion of the horizontal-direction edge of the at least one of the plurality of photodiode regions, wherein the portion is farthest from the vertical gate portion.

7. The image sensor of claim 5, wherein the at least one edge-side color adjustment path area comprises a plurality of color adjustment path areas that contact a plurality of portions of the horizontal-direction edge of the at least one of the plurality of photodiode regions.

8. The image sensor of claim 1, further comprising an impurity region located in the substrate so as to surround sidewalls and a bottom surface of the device isolation region, and being in contact with a portion of the at least one color adjustment path area.

9. The image sensor of claim 1, further comprising an impurity region located in the substrate so as to surround sidewalls and a bottom surface of the device isolation region, and being spaced apart from the at least one color adjustment path area.

10. The image sensor of claim 1, wherein the transfer transistor further comprises a horizontal gate portion extending from a top portion of the vertical gate portion along the top surface of the substrate, and
    the at least one color adjustment path area is located at a position that does not vertically overlap with the horizontal gate portion in the substrate.

11. The image sensor of claim 1, wherein the plurality of photodiode regions vertically overlap with each other.

12. The image sensor of claim 1, wherein the plurality of photodiode regions comprise a first semiconductor region having a first conductivity type, and a plurality of second semiconductor regions having a second conductivity type different from the first conductivity type, the second semiconductor regions being spaced apart from each other with the first semiconductor region interposed therebetween, and
wherein the at least one color adjustment path area comprises a third semiconductor region having the second conductivity type.

13. The image sensor of claim 12, wherein the at least one color adjustment path area has a shape of a straight pillar extending from a top second semiconductor region of the plurality of second semiconductor regions, through the first semiconductor region to a bottom second semiconductor region of the plurality of second semiconductor regions, the top second semiconductor region being closer to the top surface of the substrate, the bottom second semiconductor region being closer to a bottom surface of the substrate.

14. An image sensor comprising:
a substrate comprising a top surface, a bottom surface, and an active region;
a transfer transistor comprising a vertical gate portion extending from the top surface of the substrate in a depth direction of the substrate in the active region;
a plurality of photodiode regions located at positions of different depths with respect to the top surface of the substrate in the active region;
at least one color adjustment path area located at a position spaced apart from the vertical gate portion in the active region, the at least one color adjustment path area extending between at least two photodiode regions of the plurality of photodiode regions, and providing a charge movement path between the at least two photodiode regions;
a color filter on the substrate; and
a micro-lens on the color filter.

15. The image sensor of claim 14, wherein the image sensor comprises a backside illumination type image sensor, and the color filter is on the bottom surface of the substrate.

16. An image sensor comprising:
a semiconductor substrate including a face;
a plurality of semiconductor photodiodes in the semiconductor substrate, at different depths from the face, and being configured to absorb light of different colors; and
a semiconductor color adjustment path in the semiconductor substrate that extends between at least two of the semiconductor photodiodes that are at different depths from the face.

17. The image sensor of claim 16, wherein the semiconductor color adjustment path extends between the at least two of the semiconductor photodiodes at central portions thereof so as to be surrounded by the at least two of the semiconductor photodiodes.

18. The image sensor of claim 16, wherein the semiconductor color adjustment path extends between the at least two of the semiconductor photodiodes at peripheral portions thereof so as to be only partially surrounded by the at least two of the semiconductor photodiodes.

19. The image sensor of claim 18 further comprising a transfer transistor that extends into the semiconductor substrate from the face, wherein the semiconductor color adjustment path extends between the at least two of the semiconductor photodiodes at peripheral portions thereof that are furthest away from the transfer transistor.

20. The image sensor of claim 16 wherein a respective semiconductor photodiode includes regions of first and second different conductivity types that define a semiconductor junction therebetween that extends generally parallel to the face, wherein the semiconductor color adjustment path comprises a pillar of the first conductivity type that extends into the regions of first conductivity type of the semiconductor photodiodes.

* * * * *